(12) United States Patent
Takeshita et al.

(10) Patent No.: US 7,855,044 B2
(45) Date of Patent: Dec. 21, 2010

(54) POSITIVE RESIST COMPOSITION AND METHOD OF FORMING RESIST PATTERN

(75) Inventors: Masaru Takeshita, Kawasaki (JP); Hideo Hada, Kawasaki (JP); Takeshi Iwai, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 403 days.

(21) Appl. No.: 11/993,005

(22) PCT Filed: Jun. 16, 2006

(86) PCT No.: PCT/JP2006/312123
§ 371 (c)(1), (2), (4) Date: Dec. 18, 2007

(87) PCT Pub. No.: WO2006/137336
PCT Pub. Date: Dec. 28, 2006

(65) Prior Publication Data
US 2010/0015548 A1 Jan. 21, 2010

(30) Foreign Application Priority Data
Jun. 20, 2005 (JP) ............................. 2005-179162

(51) Int. Cl.
*G03F 7/004* (2006.01)
*G03F 7/30* (2006.01)

(52) U.S. Cl. ..................... 430/270.1; 430/326; 430/910

(58) Field of Classification Search .............. 430/270.1, 430/326, 910
See application file for complete search history.

(56) References Cited

U.S. PATENT DOCUMENTS

| | | | |
|---|---|---|---|
| 6,440,636 B1 | 8/2002 | Ushirogouchi et al. | |
| 6,692,889 B1 | 2/2004 | Funaki et al. | |
| 7,316,885 B2 * | 1/2008 | Hada et al. | 430/270.1 |
| 7,575,846 B2 * | 8/2009 | Momose et al. | 430/270.1 |
| 7,595,141 B2 * | 9/2009 | Kudo et al. | 430/270.1 |
| 2002/0068238 A1 | 6/2002 | Hada et al. | |
| 2004/0058269 A1 | 3/2004 | Hada et al. | |
| 2004/0058270 A1 | 3/2004 | Iwai et al. | |
| 2006/0147832 A1 * | 7/2006 | Hada et al. | 430/270.1 |

FOREIGN PATENT DOCUMENTS

| | | |
|---|---|---|
| JP | 2000-338674 | 12/2000 |
| JP | 2001-48933 | 2/2001 |
| JP | 2001-109154 | 4/2001 |
| JP | 2001-131232 | 5/2001 |
| JP | 2001-240625 | 9/2001 |
| JP | 2002-169292 | 6/2002 |
| JP | 2003-167346 | 6/2003 |
| JP | 2003-167347 | 6/2003 |
| JP | 2004-285327 | 10/2004 |
| JP | 2005-42090 | 2/2005 |
| TW | 200426512 A | 12/2004 |

OTHER PUBLICATIONS

Office Action issued on counterpart Taiwanese Patent Application No. 095121612, dated Aug. 25, 2009.
International Search Report in connection with corresponding PCT application No. PCT/JP2006/312123, dated Jul. 11, 2006.

* cited by examiner

*Primary Examiner*—John S Chu
(74) *Attorney, Agent, or Firm*—Knobbe, Martens, Olson & Bear, LLP

(57) ABSTRACT

A positive resist composition including a resin component (A) and an acid generator component (B), the resin component (A) including a copolymer (A1) having a structural unit (a1) derived from an acrylate ester having a monocyclic or polycyclic group-containing acid dissociable, dissolution inhibiting group, a structural unit (a2) derived from an acrylate ester having a lactone-containing cyclic group, a structural unit (a3) derived from an acrylate ester having a hydroxyl group and/or cyano group-containing polycyclic group, and a structural unit (a4) represented by general formula (a4-1) shown below:

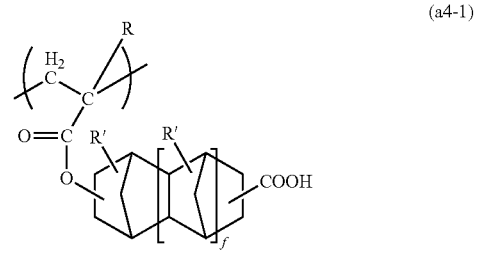

(a4-1)

wherein R represents a hydrogen atom, a halogen atom, a lower alkyl group or a halogenated lower alkyl group; R' represents a hydrogen atom, a lower alkyl group or an alkoxy group of 1 to 5 carbon atoms; and f represents 0 or 1.

3 Claims, No Drawings

POSITIVE RESIST COMPOSITION AND METHOD OF FORMING RESIST PATTERN

RELATED APPLICATIONS

This application is the U.S. National Phase filing under 35 U.S.C. §371 of PCT/JP2006/312123, filed Jun. 16, 2006, which designated the United States and was published in a language other than English, which claims priority under 35 U.S.C. §119(a)-(d) to Japanese Patent Application No. 2005-179162 filed Jun. 20, 2005. The content of these applications is incorporated herein by reference in their entireties.

TECHNICAL FIELD

The present invention relates to a positive resist composition and a method of forming a resist pattern.

BACKGROUND ART

In recent years, in the production of semiconductor elements and liquid crystal display elements, advances in lithography techniques have lead to rapid progress in the field of minaturization.

Typically, these miniaturization techniques involve shortening the wavelength of the exposure light source. Conventionally, ultraviolet radiation typified by g-line and i-line radiation has been used, but nowadays KrF excimer lasers (248 nm) have become the center of mass production, and ArF excimer lasers (193 nm) are now also starting to be introduced in mass production. Further, research is also being conducted into lithography techniques that use $F_2$ excimer lasers (157 nm), extreme ultraviolet radiation (EUV), electron beam (EB) and the like as the light source (radiation source).

Resists for use with these types of short wavelength light sources require a high resolution capable of reproducing patterns of minute dimensions, and a high level of sensitivity to these types of short wavelength light sources.

One example of a known resist that satisfies these conditions is a chemically amplified resist, which includes a base resin and an acid generator that generates acid upon exposure.

These chemically amplified resists include positive resists in which the alkali solubility of the exposed portions increases, and negative resists in which the alkali solubility of the exposed portions decreases.

Until recently, polyhydroxystyrene (PHS) or derivative resins thereof in which the hydroxyl groups are protected with acid-dissociable, dissolution-inhibiting groups (PHS-based resins), which exhibit high transparency to KrF excimer lasers (248 nm), have been used as the base resin component of chemically amplified resists. However, because PHS-based resins contain aromatic rings such as benzene rings, their transparency is inadequate for light with wavelengths shorter than 248 nm, such as light of 193 nm. Accordingly, chemically amplified resists that use a PHS-based resin as the base resin component suffer from low levels of resolution in processes that use light of 193 µnm.

As a result, resins that contain structural units derived from (meth)acrylate esters within the principal chain (acrylic resins) are now widely used as base resins for resists that use ArF excimer laser lithography, as they exhibit excellent transparency in the vicinity of 193 nm (for example, see Patent Document 1).

Further, such resists are required to exhibit not only excellent properties with respect to sensitivity and resolution, but also various lithography properties such as depth of focus (DOF) and shape of the resist pattern.

In addition to these properties, due to the recent requirement for resist pattern with high resolution, improvement in defects (surface defects) in resist pattern following developing is also required.

Defects refers to general abnormalities of a resist pattern, which are detected when observed from right above the developed resist pattern, using a surface defect detection equipment (trade name: "KLA") manufactured by KLA-TENCOR CORPORATION.

Examples of these abnormalities include post-developing scum, foam, dust, bridges across different portions of the resist pattern, color irregularities, and foreign deposits. Especially, in lithography technique using ArF excimer lasers and lithography techniques developed thereafter such as lithography technique using $F_2$ excimer lasers, EUV, electron beam (EB) and the like as the light source, when a fine pattern such as a resist pattern of no more than 130 nm is formed, these defects are becoming of serious problems.

[Patent Document 1] Japanese Unexamined Patent Application, First Publication No. 2003-167347

DISCLOSURE OF INVENTION

Problems to be Solved by the Invention

However, in the conventional resist compositions, reducing defects was difficult to be compatible with essential lithography properties.

For example, one method of reducing defects is to enhance the hydrophilicity of the base resin, thereby suppressing generation of the post-developing scum.

However, enhancing the hydrophilicity of the base resin is generally accompanied by lowering of lithography properties.

The present invention takes the above circumstances into consideration, with objects of providing a positive resist composition which not only has essential lithography properties, but also is capable of reducing defects in a resist pattern, and a method of forming a resist pattern.

Means to Solve the Problems

In order to achieve the above-mentioned object, the present invention employs the aspects described below.

A first aspect of the present invention is a positive resist composition including a resin component (A) which exhibits increased alkali solubility under action of acid and an acid generator component (B) which generates acid upon exposure, the resin component (A) including a copolymer (A1) having a structural unit (a1) derived from an acrylate ester having a monocyclic or polycyclic group-containing acid dissociable, dissolution inhibiting group, a structural unit (a2) derived from an acrylate ester having a lactone-containing cyclic group, a structural unit (a3) derived from an acrylate ester having a hydroxyl group and/or cyano group-containing polycyclic group, and a structural unit (a4) represented by general formula (a4-1) shown below:

[Chemical Formula 1]

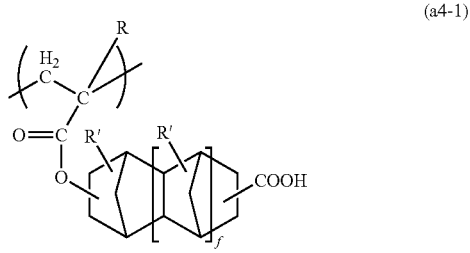

(a4-1)

wherein R represents a hydrogen atom, a halogen atom, a lower alkyl group or a halogenated lower alkyl group; R' represents a hydrogen atom, a lower alkyl group or an alkoxy group of 1 to 5 carbon atoms, wherein when two R' are present, the two R' may be the same or different; and f represents 0 or 1.

A second aspect of the present invention is a method of forming a resist pattern, including: using a positive resist composition according to the first aspect to form a resist film on a substrate; conducting exposure of the resist film; and developing the resist film to form a resist pattern.

In the present description and the claims, the term "structural unit derived from an acrylate ester" refers to a structural unit that is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. As the substituent, a halogen atom, a lower alkyl group or a halogenated lower alkyl group can be mentioned. Examples of the halogen atom include a fluorine atom, a chlorine atom, a bromine atom and an iodine atom, and a fluorine atom is particularly desirable.

With respect to the "structural unit derived from an acrylate ester", the "α-position (the carbon atom on the α-position)" refers to the carbon atom having the carbonyl group bonded thereto, unless otherwise specified.

An "alkyl group" includes linear, branched or cyclic, monovalent saturated hydrocarbon, unless otherwise specified.

A "lower alkyl group" is an alkyl group of 1 to 5 carbon atoms.

With respect to the acrylate ester, specific examples of the lower alkyl group for the substituent at the α-position include linear or branched alkyl groups such as a methyl group, ethyl group, propyl group, isopropyl group, n-butyl group, isobutyl group, tert-butyl group, pentyl group, isopentyl group, and neopentyl group.

A "halogenated lower alkyl group" refers to a lower alkyl group in which some or all of the hydrogen atoms are substituted with halogen atoms.

In the present invention, it is preferable that a hydrogen atom, a halogen atom, a lower alkyl group or a halogenated lower alkyl group is bonded to the α-position of the acrylate ester, more preferably a hydrogen atom, a fluorine atom, a lower alkyl group or a fluorinated lower alkyl group. In terms of industrial availability, a hydrogen atom or a methyl group is particularly desirable.

The term "structural unit" refers to a monomer unit which constitutes a polymer.

The term "exposure" is used as a general concept that includes irradiation with any form of radiation.

Effect of the Invention

According to the present invention, there is provided a positive resist composition which not only has essential lithography properties, but also is capable of reducing defects in a resist pattern, and a method of forming a resist pattern.

BEST MODE FOR CARRYING OUT THE INVENTION

Positive Resist Composition

The positive resist composition of the present invention includes a resin component (A) (hereafter, frequently referred to as "component A") which exhibits increased alkali solubility under action of acid and an acid-generator component (B) (hereafter, frequently referred to as "component (B)") which generates acid upon irradiation.

In the positive resist composition of the present invention, the component (A) is alkali-insoluble prior to exposure. When the acid generated from the component (B) upon exposure acts on the component (A), the acid dissociable, dissolution inhibiting groups are dissociated and the alkali-solubility of the entire component (A) is enhanced. As a result, the positive resist composition changes from alkali-insoluble to alkali soluble. Therefore, in the formation of a resist pattern, when a resist film obtained by using the positive resist composition is subjected to selective exposure, the exposed area becomes soluble in an alkali, while the unexposed area remains alkali-insoluble, and hence a resist pattern can be formed by developing with an alkali.

<Component (A)>

In the present invention, the component (A) is a resin component including a copolymer (A1) having a structural unit (a1) derived from an acrylate ester having a monocyclic or polycyclic group-containing acid dissociable, dissolution inhibiting group, a structural unit (a2) derived from an acrylate ester having a lactone-containing cyclic group, a structural unit (a3) derived from an acrylate ester having a hydroxyl group and/or cyano group-containing polycyclic group, and a structural unit (a4) represented by general formula (a4-1) shown above.

Structural Unit (a1)

The structural unit (a1) is a structural unit derived from an acrylate ester having a monocyclic or polycyclic group-containing acid dissociable, dissolution inhibiting group.

The monocyclic or polycyclic group-containing acid dissociable, dissolution inhibiting group within the structural unit (a1) may be any of those proposed as monocyclic or polycyclic group-containing acid dissociable, dissolution inhibiting groups for the base resins of a conventional chemical amplified resist composition, as long as it exhibits alkali-dissolution inhibiting property to render the entire copolymer (A1) alkali insoluble prior to dissolution, and changes the entire compound (A1) alkali soluble following dissociation.

Typically, groups which form a cyclic tertiary alkyl ester or cyclic alkoxyalkyl ester with the carboxyl group of (meth) acrylic acid are widely known.

In the present description, the term "(meth)acrylic acid" refers to either or both of acrylic acid and methacrylic acid. Further, the term "(meth)acrylate ester" is a generic term that includes either or both of the acrylate ester having a hydrogen atom bonded to the α-position and the methacrylate ester having a methyl group bonded to the α-position.

Here, the term "tertiary alkyl ester" is a structure in which the hydrogen atom of a carboxy group is substituted with a cyclic alkyl group to form an ester, and the tertiary carbon atom of the cyclic alkyl group is bonded to the terminal oxygen atom of the carbonyloxy group (—C(O)—O—). When acid acts on the tertiary alkyl ester, the bond between the oxygen atom and the tertiary carbon atom is broken.

The cyclic alkyl group may have a substituent.

Hereafter, for the sake of convenience, a group which forms a tertiary alkyl ester with a carboxy group so as to be acid dissociable is referred to as a "tertiary alkyl ester-type acid dissociable, dissolution inhibiting group".

Further, the term "cyclic alkoxyalkyl ester" is a structure in which the hydrogen atom of a carboxy group is substituted with a cyclic alkoxyalkyl group to form an ester, and the alkoxyalkyl group is bonded to the terminal oxygen atom of the carbonyloxy group (—C(O)—O—). When acid acts on the alkoxyalkyl ester, the bond between the oxygen atom and the alkoxyalkyl group is broken.

As the structural unit (a1), it is preferable to use at least one member selected from the group consisting of structural units represented by formula (a1-0-1) shown below and structural units represented by formula (a1-0-2) shown below.

[Chemical Formula 2]

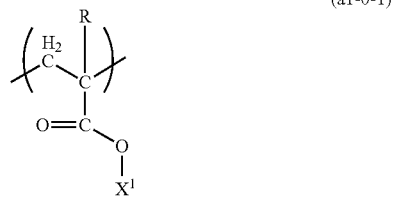

(a1-0-1)

wherein R represents a hydrogen atom, a halogen atom, a lower alkyl group or a halogenated lower alkyl group; and $X^1$ represents a monocyclic or polycyclic group-containing acid dissociable, dissolution inhibiting group.

[Chemical Formula 3]

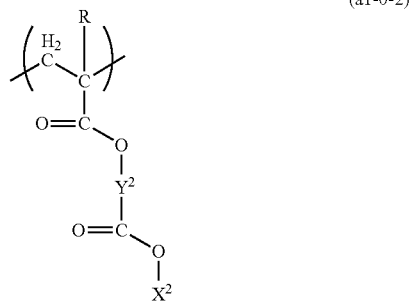

(a1-0-2)

wherein R represents a hydrogen atom, a halogen atom a lower alkyl group or a halogenated lower alkyl group; $X^2$ represents a monocyclic or polycyclic group-containing acid dissociable, dissolution inhibiting group; and $Y^2$ represents an alkylene group or an aliphatic cyclic group.

In general formula (a1-0-1) shown above, the halogen atom, lower alkyl group and halogenated lower alkyl group for R are the same as the halogen atom, lower alkyl group or halogenated lower alkyl group which can be bonded to the α-position of the aforementioned acrylate ester.

$X^1$ is not particularly limited as long as it is a monocyclic or polycyclic group-containing acid dissociable, dissolution inhibiting group. Examples thereof include cyclic alkoxyalkyl groups, tertiary alkyl ester-type acid dissociable, dissolution inhibiting groups, and a tertiary alkyl ester-type acid dissociable, dissolution inhibiting group is preferable.

Examples of tertiary alkyl ester-type acid dissociable, dissolution inhibiting groups include aliphatic cyclic group-containing acid dissociable, dissolution inhibiting groups.

The term "aliphatic" is a relative concept used in relation to the term "aromatic", and defines a group or compound that has no aromaticity.

Further, the term "aliphatic cyclic group" refers to a monocyclic group or polycyclic group that has no aromaticity.

The "aliphatic cyclic group" within the structural unit (a1) may or may not have a substituent Examples of substituents include lower alkyl groups of 1 to 5 carbon atoms, fluorine atom, fluorinated lower alkyl groups of 1 to 5 carbon atoms which are lower alkyl groups substituted with fluorine atoms, and oxygen atom (=O).

The basic ring of the "aliphatic cyclic group" exclusive of substituents is not limited to be constituted from only carbon and hydrogen (not limited to hydrocarbon groups), but is preferably a hydrocarbon group.

Further, the "hydrocarbon group" may be either saturated or unsaturated, but is preferably saturated. Furthermore, the hydrocarbon group is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be exemplified.

Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be mentioned. Specific examples include 2-methyl-2-adamantyl group and a 2-ethyl-2-adamantyl group. Further, groups having an aliphatic cyclic group such as an adamantyl group and a branched alkylene group having a tertiary carbon atom bonded thereto, as in the structural unit represented by general formula (a4-1)' shown below, can be exemplified.

[Chemical Formula 4]

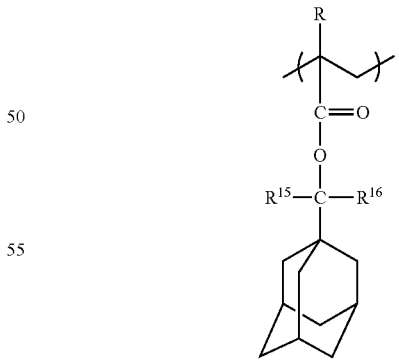

wherein R represents a hydrogen atom, a halogen atom a lower alkyl group or a halogenated lower alkyl group; and $R^{15}$ and $R^{16}$ each independently represents an alkyl group (which may be linear or branched, and preferably has 1 to 5 carbon atoms).

In general formula (a4-1)' shown above, the halogen atom, lower alkyl group or halogenated lower alkyl group for R are the same as the halogen atom lower alkyl group or halogenated lower alkyl group which can be bonded to the α-position of the aforementioned acrylate ester.

Further, as the cyclic alkoxyalkyl group, groups represented by general formula shown below are preferable.

[Chemical Formula 5]

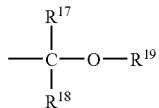

wherein $R^{17}$ and $R^{18}$ each independently represents an alkyl group or a hydrogen atom; and $R^{19}$ represents a cycloalkyl group or an alkylene group which is bonded to the terminal of $R^{17}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a cycloalkyl group or alkylene group which preferably has 1 to 15 carbon atoms, and may be any of cyclic, linear or branched.

When $R^{19}$ represents a cycloalkyl group, it preferably has 4 to 15 carbon atoms, more preferably 4 to 12 carbon atoms, and most preferably 5 to 10 carbon atoms.

As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be exemplified. Specific examples include groups in which one or more hydrogen atoms have been removed from monocycloalkanes such as cyclopentane and cyclohexane, and groups in which one or more hydrogen atoms have been removed from polycycloalkanes such as adamantane, norbornane, isobornane, tricyclodecane and tetracyclododecane. Of these, a group in which one or more hydrogen atoms have been removed from adamantane is preferable.

When $R^{19}$ is an alkylene group, it preferably has 1 to 5 carbon atoms. It is more preferable that the alkylene group be a ethylene group or a methylene group, and it is most preferable that the alkylene group be an ethylene group.

Specifically, $R^{17}$ and $R^{19}$ may each independently represent an alkylene group of 1 to 5 carbon atoms, and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4 to 7-membered ring, and more preferably a 4 to 6-membered ring. Specific examples of the cyclic group include tetrahydropyranyl group and tetrahydrofuranyl group.

In general formula (a1-0-2), the halogen atom, lower alkyl group or halogenated lower alkyl group for R are the same as the halogen atom, lower alkyl group or halogenated lower alkyl group which can be bonded to the α-position of the aforementioned acrylate ester. $X^2$ is the same as $X^1$ in formula (a1-0-1).

$Y^2$ is an alkylene group of 1 to 4 carbon atoms or a divalent aliphatic cyclic group. As the aliphatic cyclic group, the same as those exemplified above in connection with the explanation of "aliphatic cyclic group" can be used, except that two hydrogen atoms have been removed therefrom.

Specific examples of the structural unit (a1) include structural units represented by general formulas (a1-1) to (a1-4) shown below.

[Chemical Formula 6]

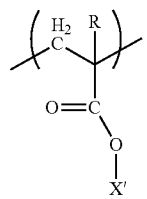

(a1-1)

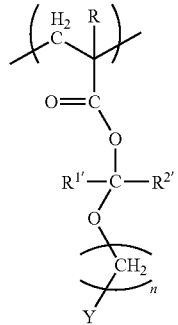

(a1-2)

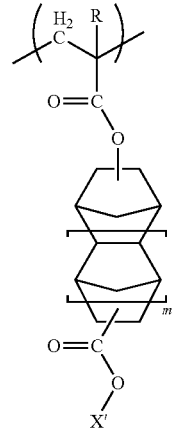

(a1-3)

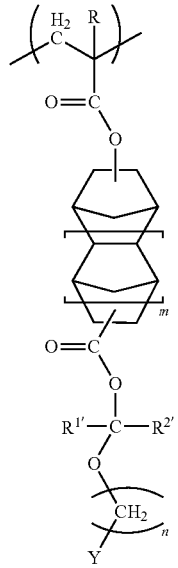

(a1-4)

wherein X' represents a monocyclic or polycyclic group-containing tertiary alkyl ester-type acid dissociable, dissolution inhibiting group; Y represents an aliphatic cyclic group; n represents 0 or an integer of 1 to 3; m represents 0 or 1; R represents a hydrogen atom, a halogen atom, a lower alkyl group or a halogenated lower alkyl group; and $R^{1\prime}$ and $R^{2\prime}$ each independently represents a hydrogen atom or a lower alkyl group of 1 to 5 carbon atoms.

In general formulas (a1-1) to (a1-4), the halogen atom, lower alkyl group or halogenated lower alkyl group for R are the same as the halogen atom, lower alkyl group or halogenated lower alkyl group which can be bonded to the α-position of the aforementioned acrylate ester.

It is preferable that at least one of $R^{1\prime}$ and $R^{2\prime}$ represent a hydrogen atom, and it is more preferable that both of $R^{1\prime}$ and $R^{2\prime}$ represent a hydrogen atom. n is preferably 0 or 1.

Examples of the tertiary alkyl ester-type acid dissociable, dissolution inhibiting group for X' are the same as the tertiary alkyl ester-type acid dissociable, dissolution inhibiting groups exemplified above as monocyclic or polycyclic group-containing acid for $X^1$.

Examples of the aliphatic cyclic group as Y are the same as those exemplified above in connection with the explanation of "aliphatic cyclic group".

Specific examples of structural units represented by general formula (a1-1) to (a1-4) are shown below.

[Chemical Formula 7]

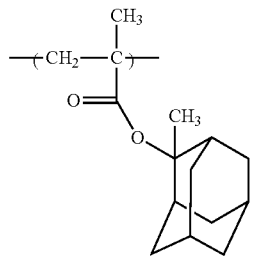
(a1-1-1)

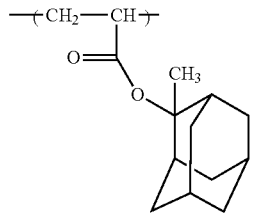
(a1-1-2)

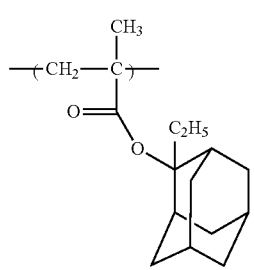
(a1-1-3)

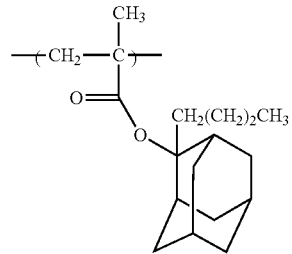
(a1-1-4)

(a1-1-5)

(a1-1-6)

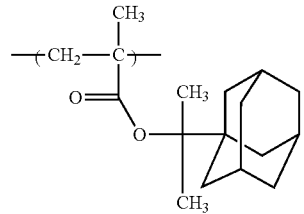
(a1-1-7)

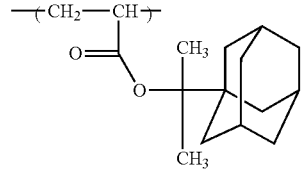
(a1-1-8)

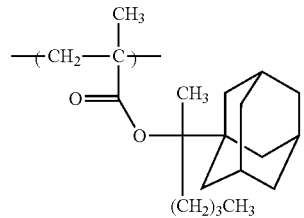
(a1-1-9)

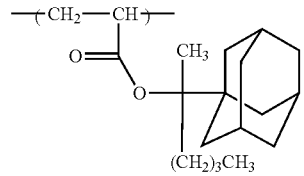
(a1-1-10)

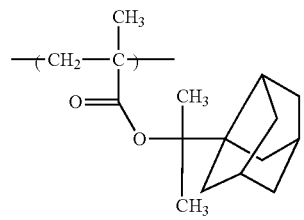

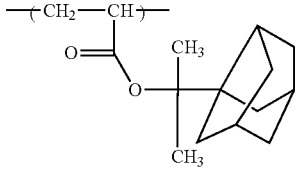

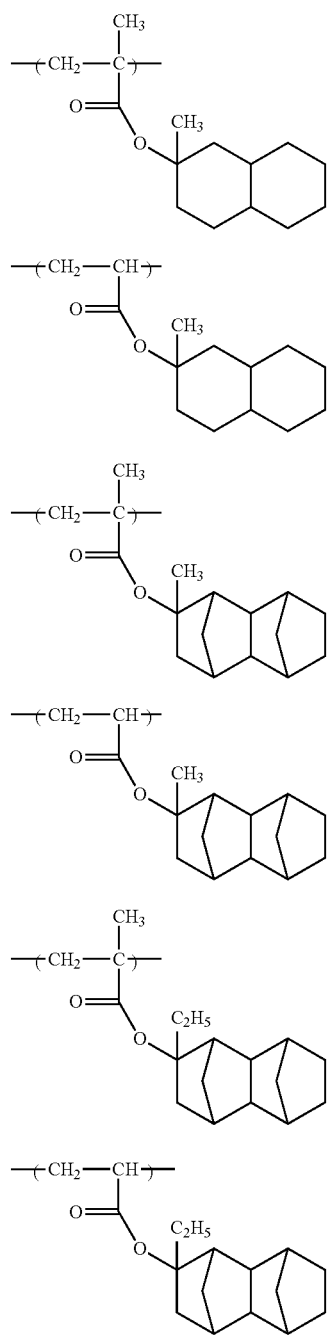
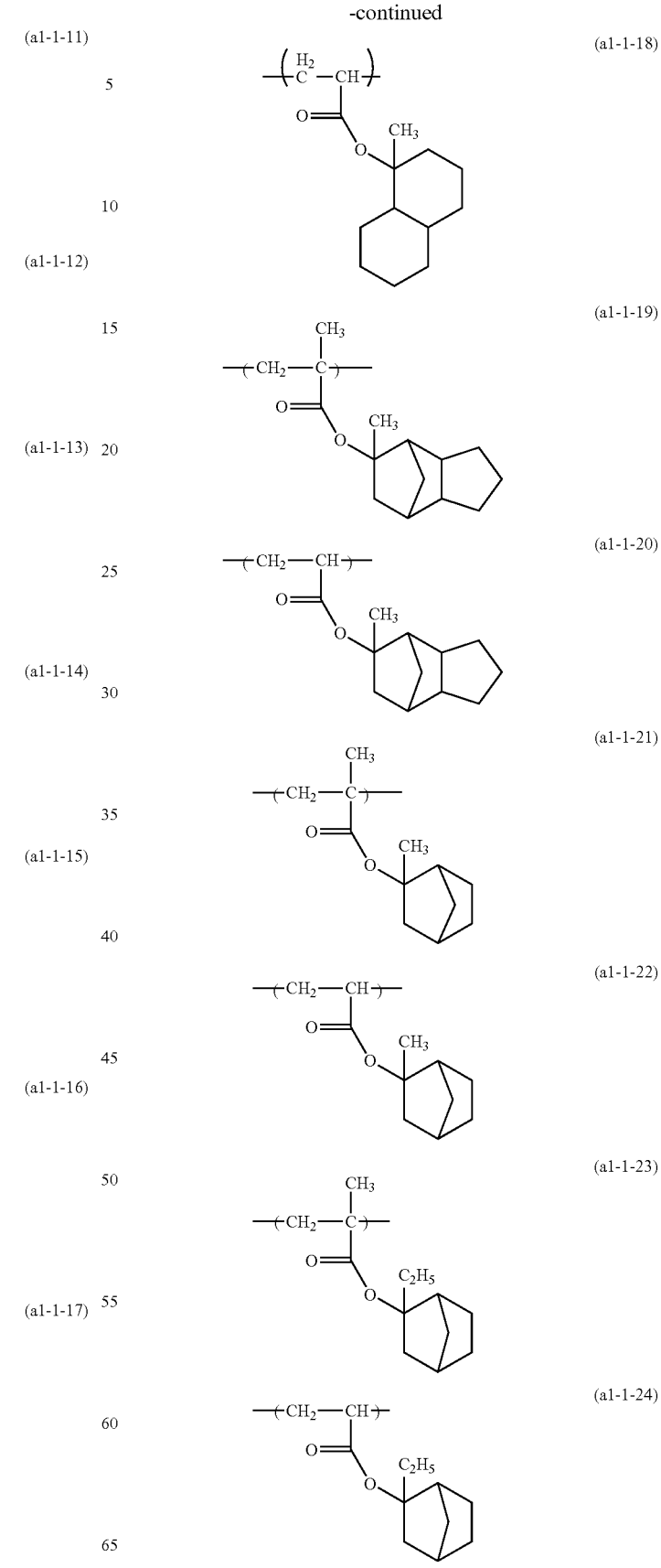

-continued
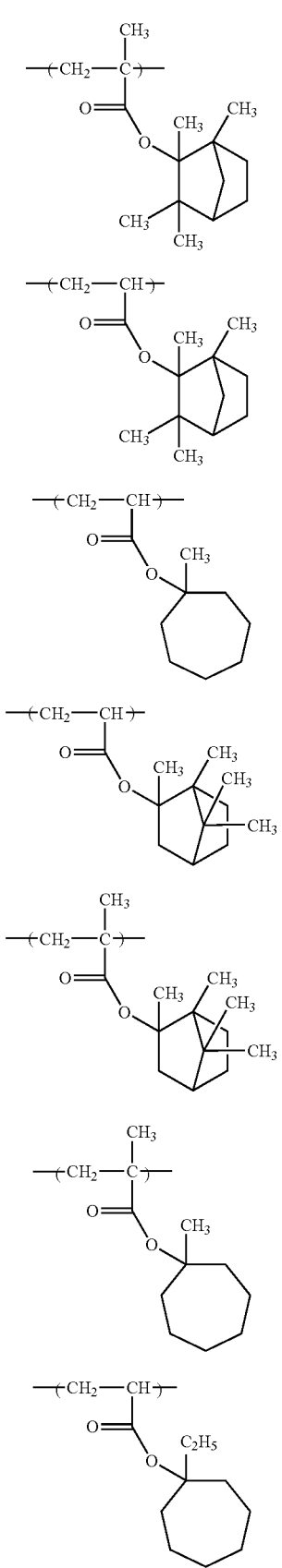
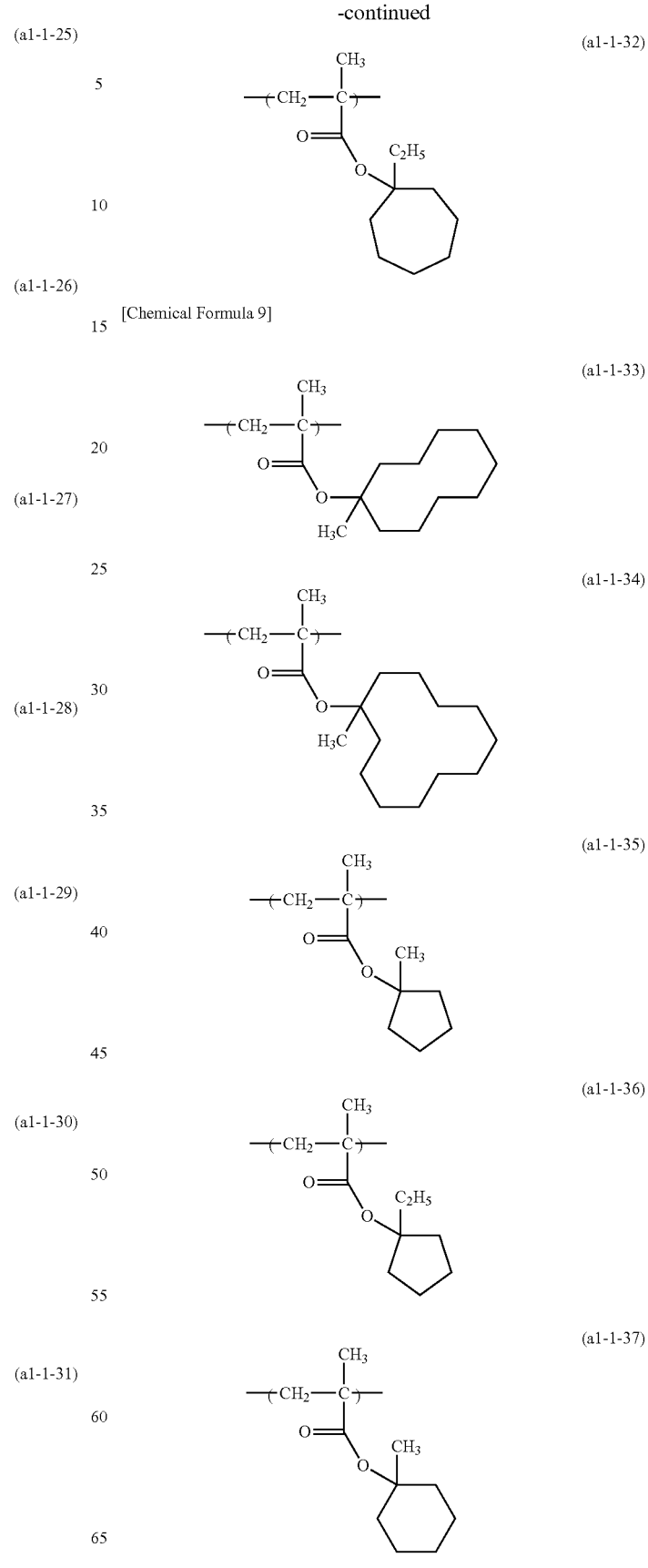
[Chemical Formula 9]

(a1-1-38) 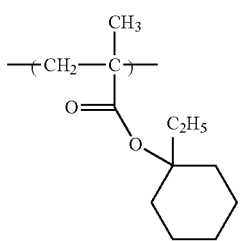
(a1-1-39) 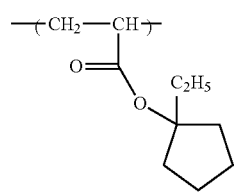
(a1-1-40) 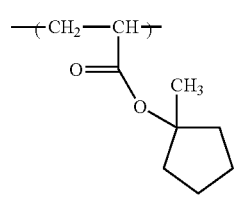
(a1-1-41) 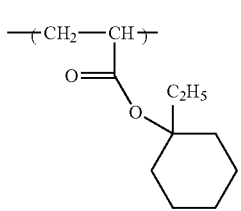
[Chemicl Formula 10]
(a1-2-1) 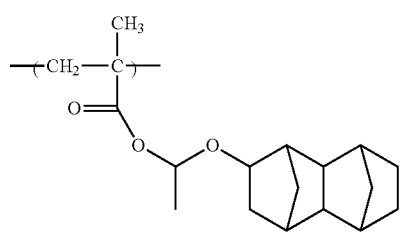
(a1-2-2) 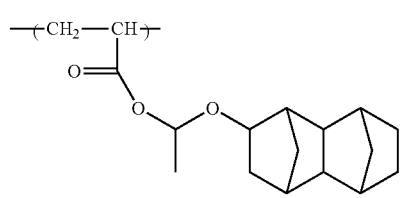
(a1-2-3) 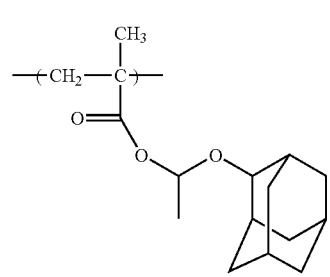
(a1-2-4) 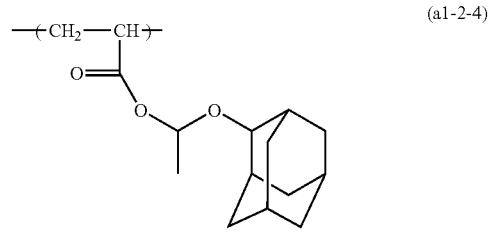
(a1-2-5) 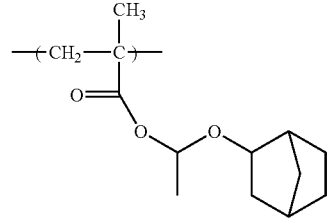
(a1-2-6) 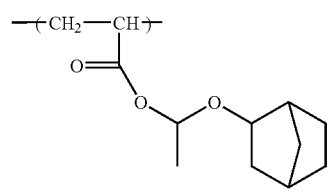
[Chemical Formula 11]
(a1-2-7) 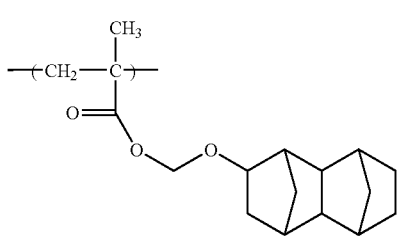
(a1-2-8) 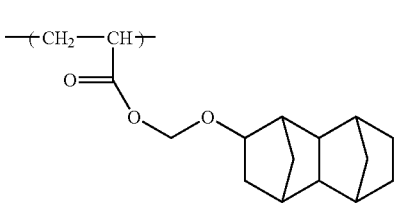
(a1-2-9) 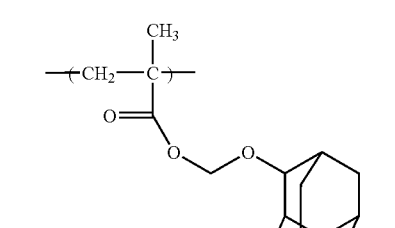
(a1-2-10) 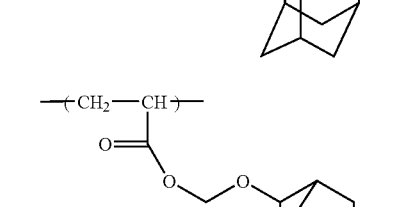

-continued
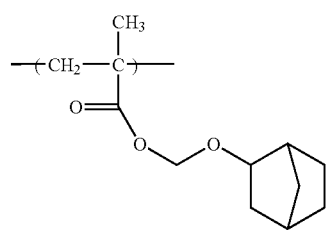
(a1-2-11)
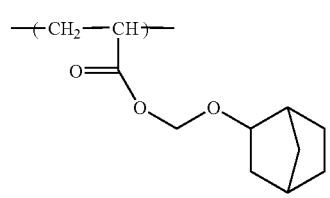
(a1-2-12)
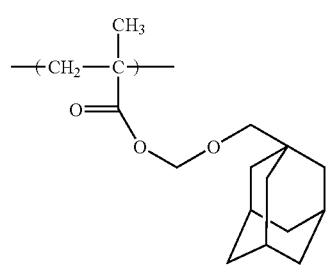
(a1-2-13)
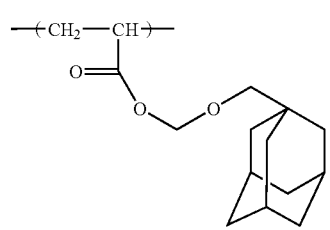
(a1-2-14)
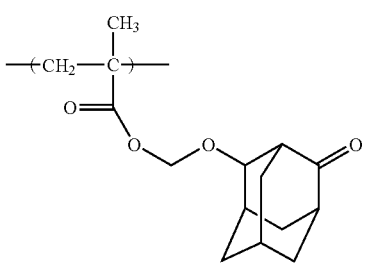
(a1-2-15)
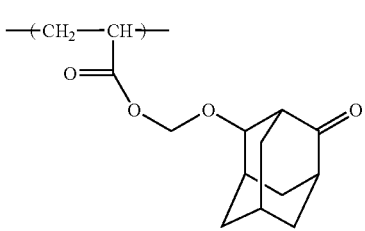
(a1-2-16)
-continued
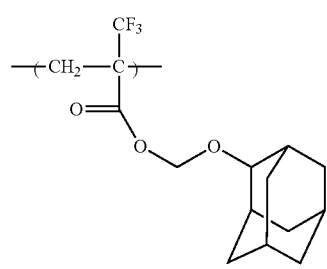
(a1-2-17)
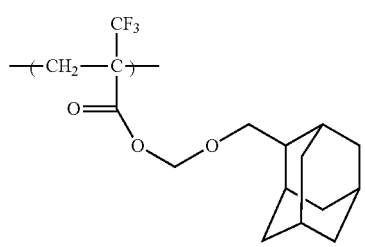
(a1-2-18)
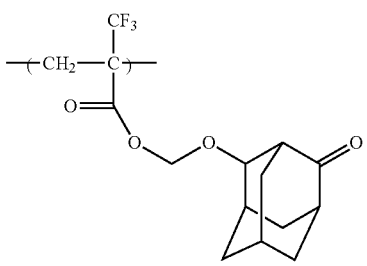
(a1-2-19)
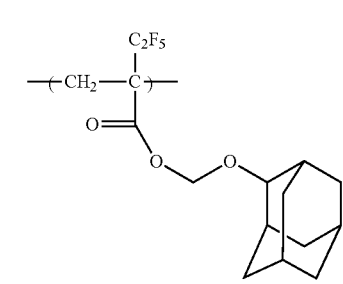
(a1-2-20)
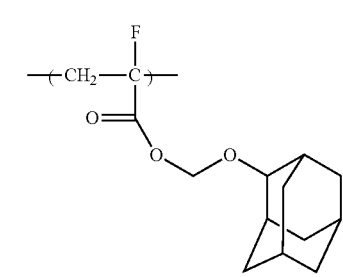
(a1-2-21)

[Chemical Formula 12]
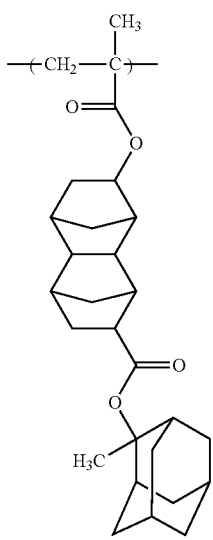
(a1-3-1)
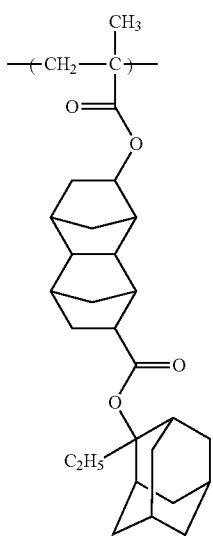
(a1-3-2)
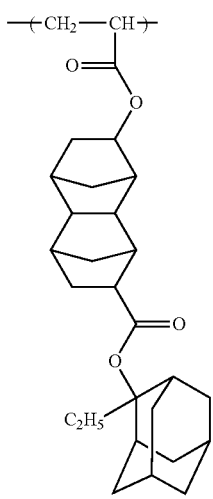
(a1-3-3)
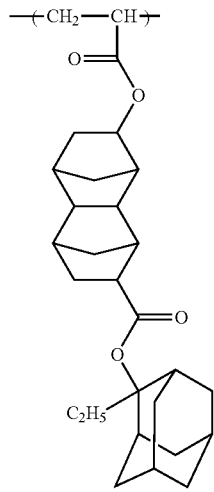
(a1-3-4)
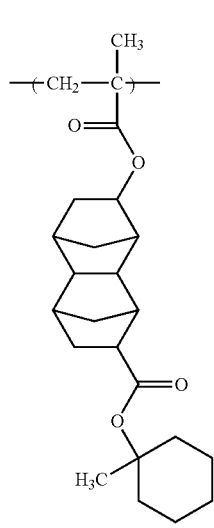
(a1-3-5)
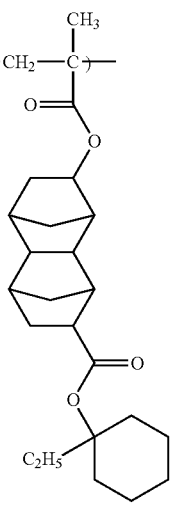
(a1-3-6)

-continued
(a1-3-7)
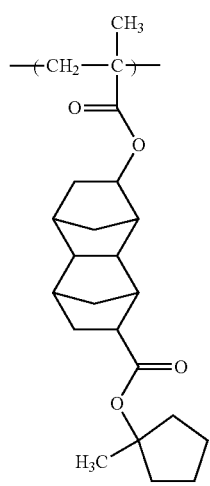
(a1-3-8)
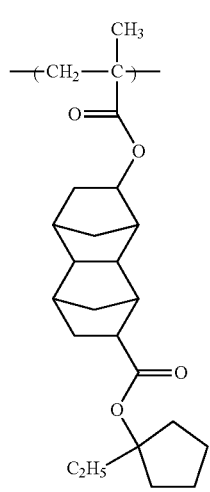
(a1-3-9)
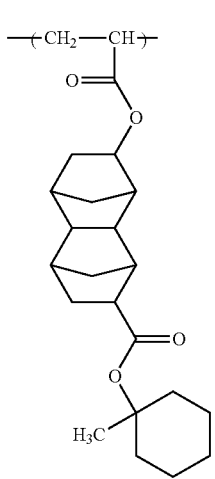
-continued
(a1-3-10)
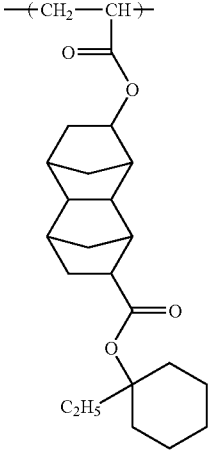
(a1-3-11)
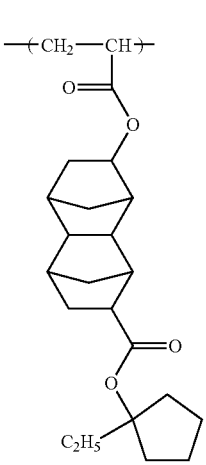
(a1-3-12)

-continued
[Chemical Formula 13]
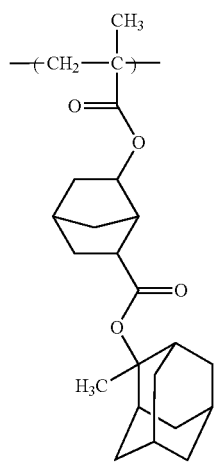 (a1-3-13)
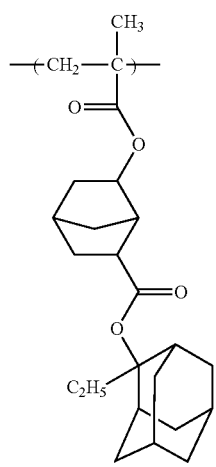 (a1-3-14)
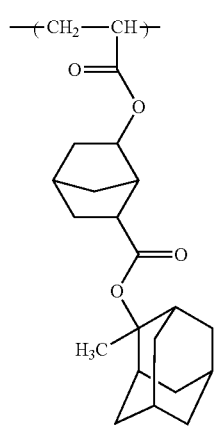 (a1-3-15)
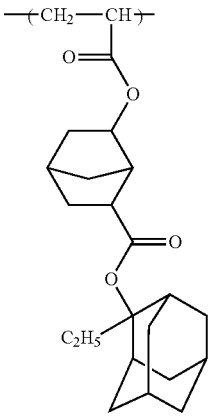 (a1-3-16)
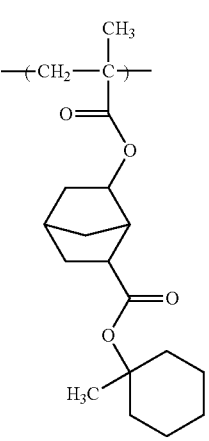 (a1-3-17)
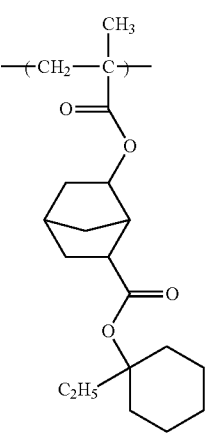 (a1-3-18)

-continued
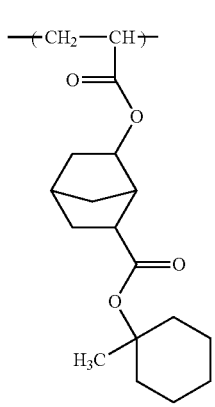
(a1-3-19)
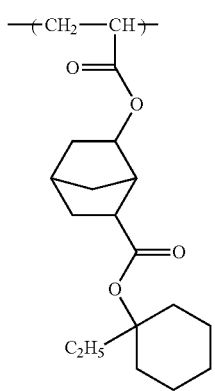
(a1-3-20)
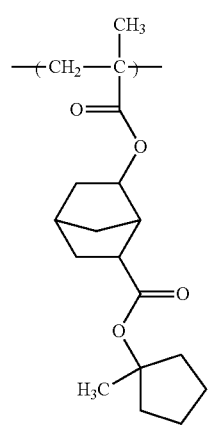
(a1-3-21)
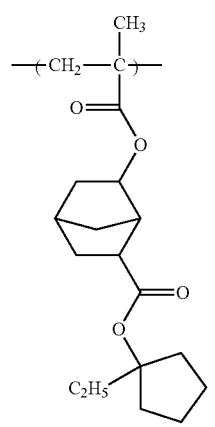
(a1-3-22)
-continued
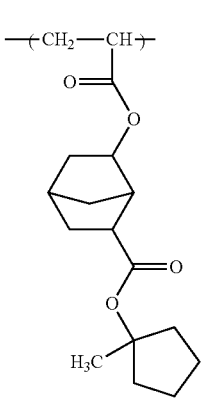
(a1-3-23)
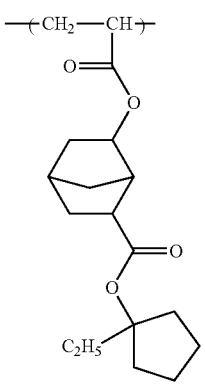
(a1-3-24)
[Chemical Formula 14]
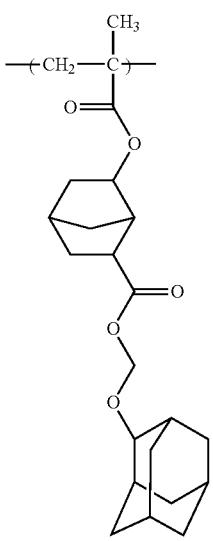
(a1-4-5)

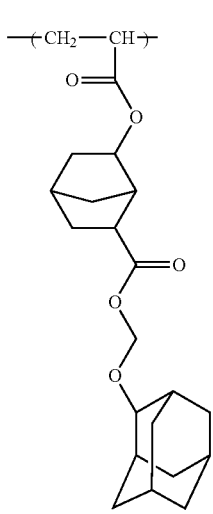
(a1-4-6)
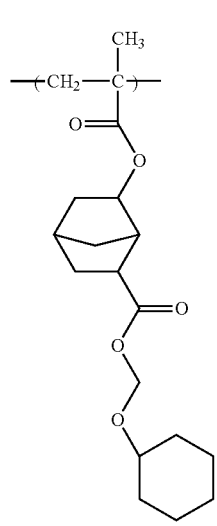
(a1-4-9)
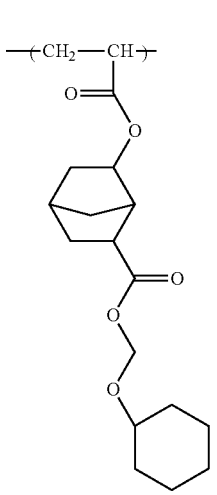
(a1-4-10)
(a1-4-7)
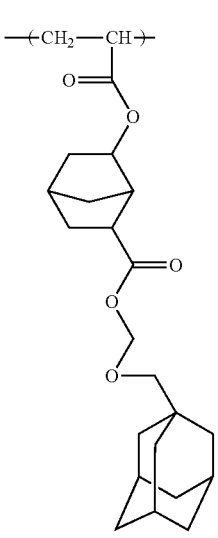
(a1-4-8)
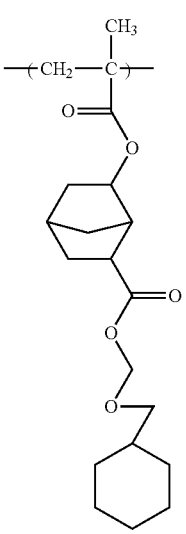
(a1-4-11)

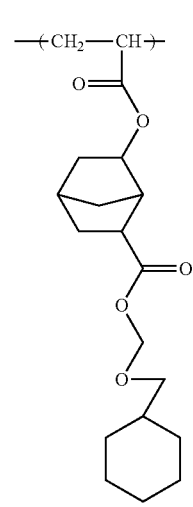
(a1-4-12)
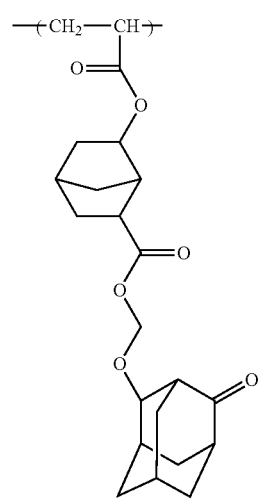
(a1-4-13)
(a1-4-14)
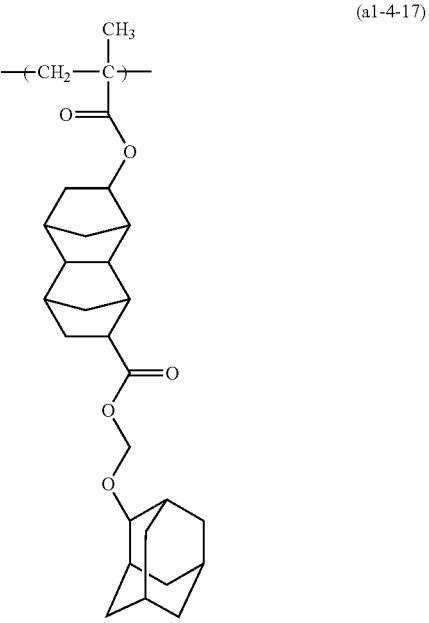
(a1-4-17)
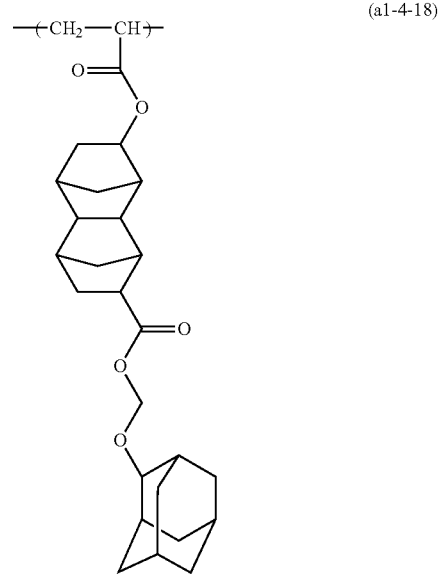
(a1-4-18)

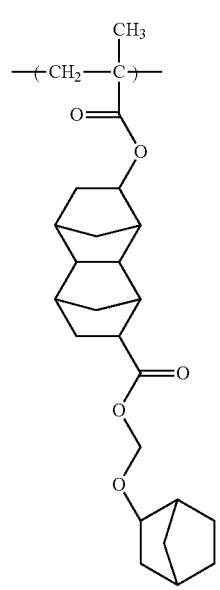
(a1-4-19)
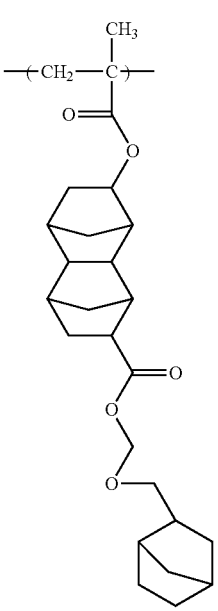
(a1-4-21)
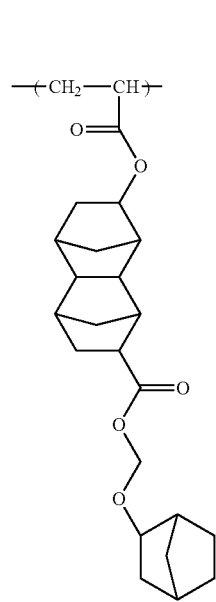
(a1-4-20)
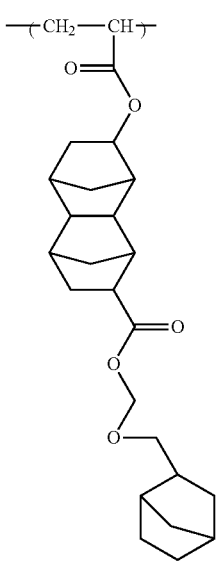
(a1-4-22)

(a1-4-23)
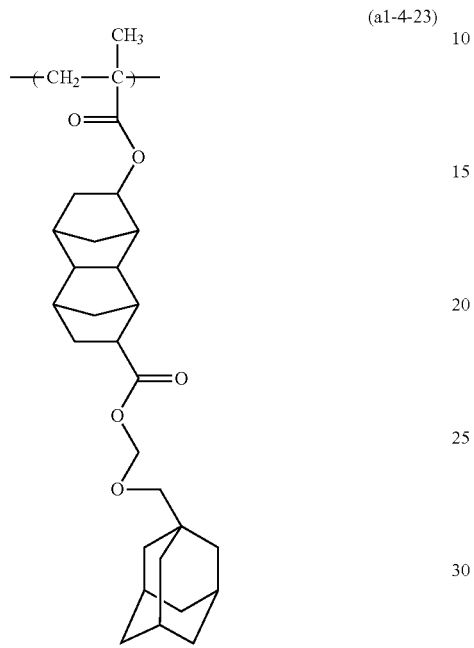
(a1-4-24)
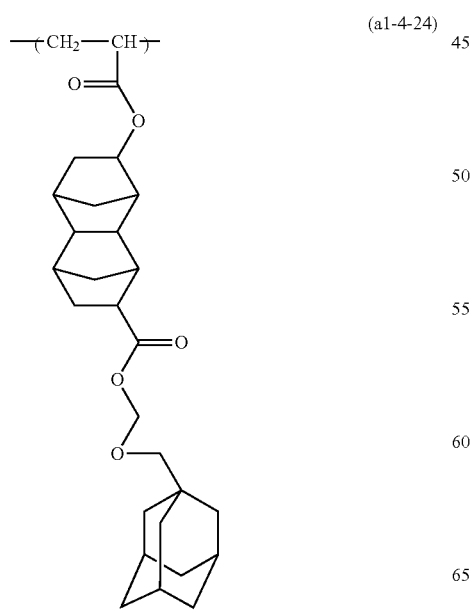
(a1-4-25)
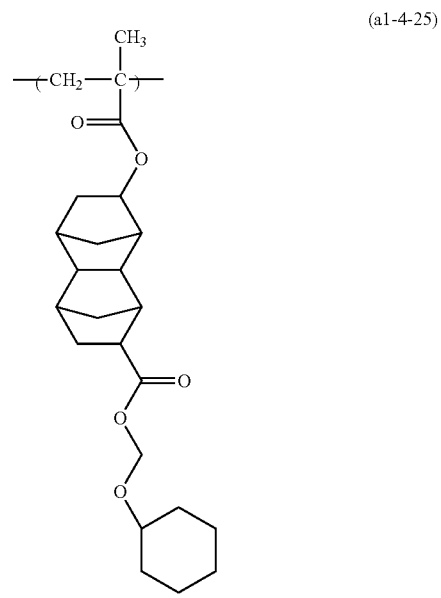
(a1-4-26)
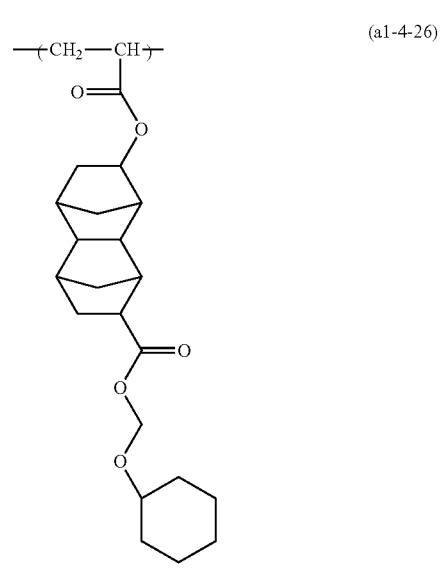

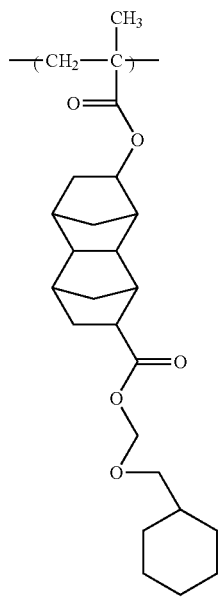
(a1-4-27)

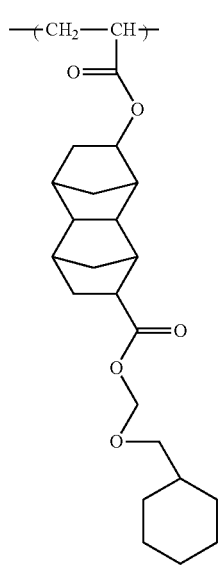
(a1-4-28)

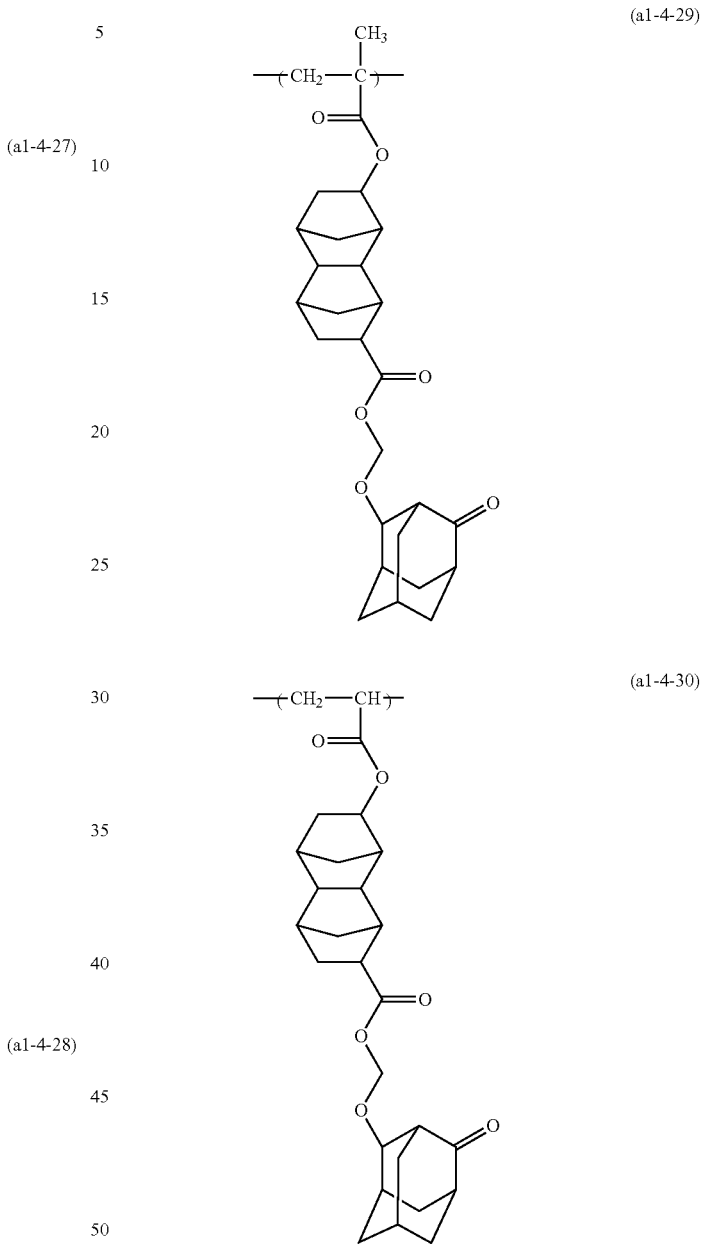

Among these, structural units represented by general formula (a1-1) are preferable. More specifically, at least one structural unit selected from the group consisting of structural units represented by formulas (a1-0-1) to (a-1-6) and (a1-1-35) to (a1-1-41) is more preferable.

Further, as the structural unit (a1), structural units represented by general formula (a1-1-01) shown below which includes the structural units represented by formulas (a1-1-1) to (a1-1-4), and structural units represented by general formula (a1-1-02) shown below which includes the structural units represented by formulas (a1-0-36), (a1-1-38), (a1-1-39) and (a1-1-41) are preferable.

[Chemical Formula 16]

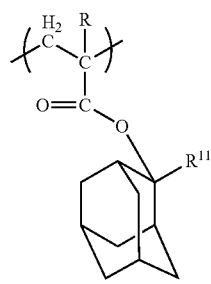

(a1-1-01)

wherein R represents a hydrogen atom, a halogen atom, a lower alkyl group or a halogenated lower alkyl group; and $R^{11}$ represents a lower alkyl group.

[Chemical Formula 17]

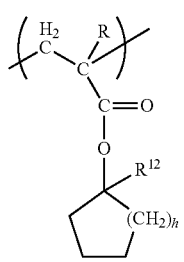

(a1-1-02)

wherein R represents a hydrogen atom, a halogen atom, a lower alkyl group or a halogenated lower alkyl group; $R^{12}$ represents a lower alkyl group; and h represents an integer of 1 to 3.

In general formula (a1-1-01), the halogen atom, lower alkyl group or halogenated lower alkyl group for R are the same as the halogen atom, lower alkyl group or halogenated lower alkyl group which can be bonded to the α-position of the aforementioned acrylate ester.

The lower alkyl group for $R^{11}$ is the same as the lower alkyl group for R above. $R^{11}$ is preferably a methyl group or an ethyl group, and most preferably a methyl group.

In general formula (a1-1-01), the halogen atom, lower alkyl group or halogenated lower alkyl group for R are the same as the halogen atom, lower alkyl group or halogenated lower alkyl group which can be bonded to the α-position of the aforementioned acrylate ester.

The lower alkyl group for $R^{12}$ is the same as the lower alkyl group for R above. $R^{12}$ is preferably a methyl group or an ethyl group, and most preferably a methyl group. h is preferably 1 or 2, and most preferably 2.

Among the structural units exemplified above, those represented by general formula (a1-1-01) shown above are particularly desirable, and the structural unit represented by general formula (a1-1-1) is most preferable.

As the structural unit (a1), one type may be used alone, or two or more types may be used in combination.

In the copolymer (A1), the amount of the structural unit (a1) based on the combined total of all structural units constituting the copolymer (A1) is preferably 10 to 80 mol %, more preferably 20 to 70 mol %, still more preferably 25 to 50 mol %, and most preferably 30 to 50 mol %. By making the amount of the structural unit (a1) at least as large as the lower limit of the above-mentioned range, a pattern can be formed using a resist composition prepared from the copolymer (A1). On the other hand, by making the amount of the structural unit (a1) no more than the upper limit of the above-mentioned range, a good balance can be achieved with the other structural units.

Structural Unit (a2)

The copolymer (A1) has a structural unit (a2) derived from an acrylate ester having a lactone-containing cyclic group, as well as the structural unit (a1).

The term "lactone-containing cyclic group", refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the copolymer (A1) is used for forming a resist film, the lactone-containing cyclic group of the structural unit (a2) is effective in improving the adhesion between the resist film and the substrate, and increasing the hydrophilicity to the developing solution.

As the structural unit (a2), there is no particular limitation, and an arbitrary structural unit may be used.

Specific examples of lactone-containing monocyclic groups include groups in which one hydrogen atom has been removed from γ-butyrolactone.

Specific examples of lactone-containing polycyclic groups include groups in which one hydrogen atom has been removed from a lactone ring-containing bicycloalkane, tricycloalkane or tetracycloalkane. Especially in consideration of industrial availability, groups in which one hydrogen atom has been removed from a lactone-containing tricycloalkane with the type of structural formula shown below are preferable.

[Chemical Formula 18]

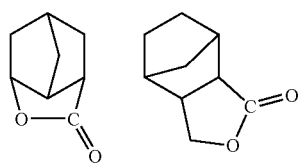

More specifically, examples of the structural unit (a2) include structural units represented by general formulas (a2-1) to (a2-5) shown below.

[Chemical Formula 19]

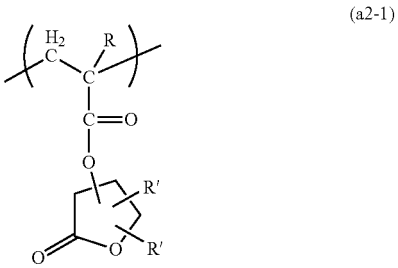

(a2-1)

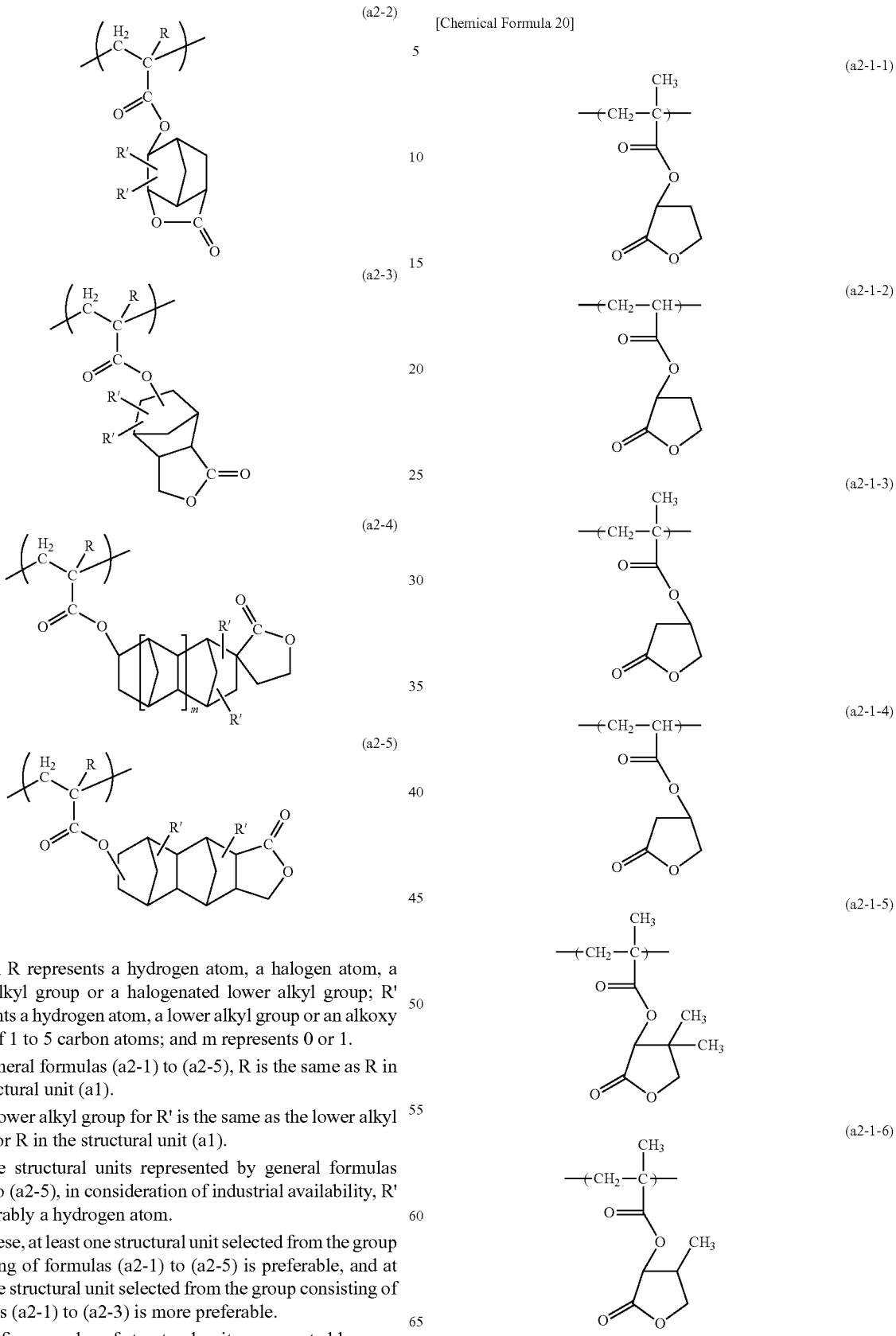

wherein R represents a hydrogen atom, a halogen atom, a lower alkyl group or a halogenated lower alkyl group; R' represents a hydrogen atom, a lower alkyl group or an alkoxy group of 1 to 5 carbon atoms; and m represents 0 or 1.

In general formulas (a2-1) to (a2-5), R is the same as R in the structural unit (a1).

The lower alkyl group for R' is the same as the lower alkyl group for R in the structural unit (a1).

In the structural units represented by general formulas (a2-1) to (a2-5), in consideration of industrial availability, R' is preferably a hydrogen atom.

Of these, at least one structural unit selected from the group consisting of formulas (a2-1) to (a2-5) is preferable, and at least one structural unit selected from the group consisting of formulas (a2-1) to (a2-3) is more preferable.

Specific examples of structural units represented by general formulas (a2-1) to (a2-5) above are shown below.

[Chemical Formula 21]
(a2-2-1) 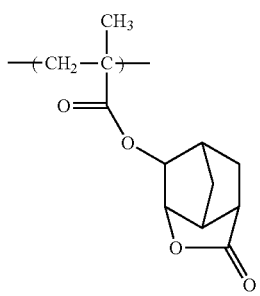
(a2-2-2) 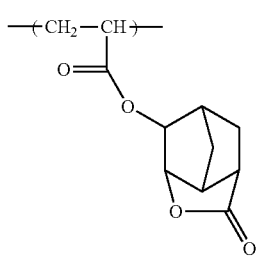
(a2-2-3) 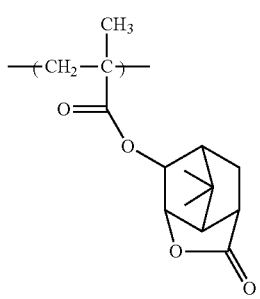
(a2-2-4) 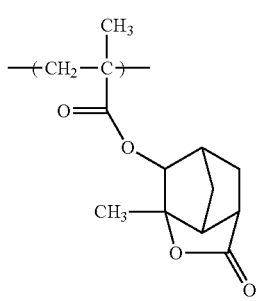
(a2-2-5) 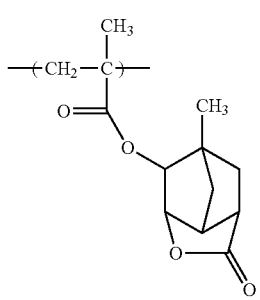
[Chemical Formula 22]
(a2-3-1) 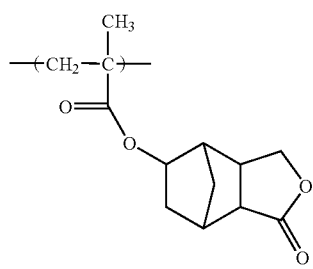
(a2-3-2) 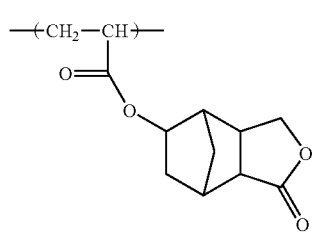
(a2-3-3) 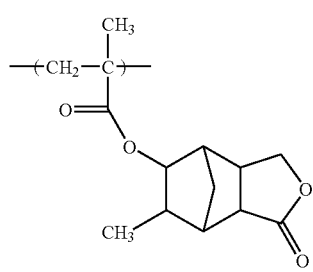
(a2-3-4) 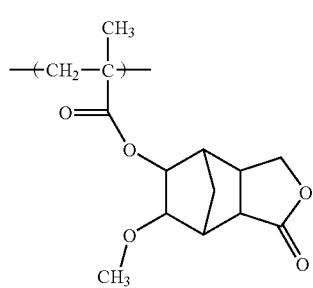
(a2-3-5) 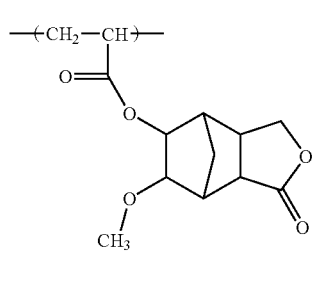

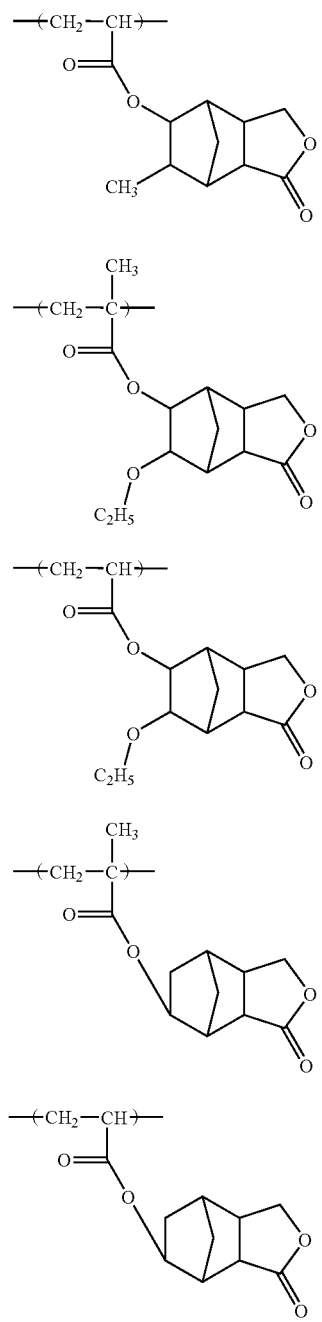
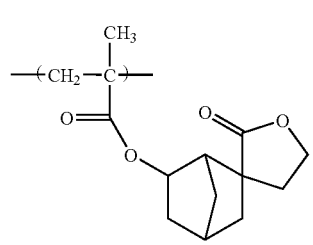
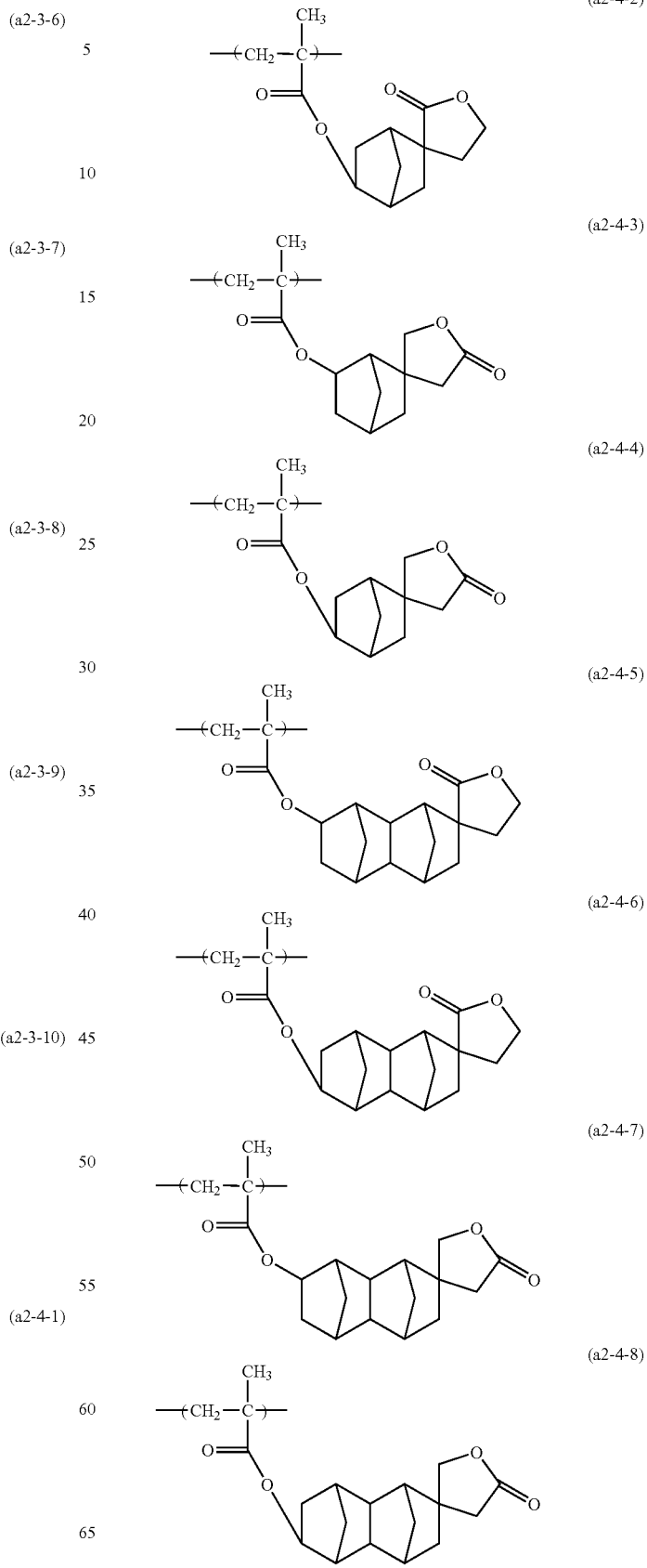

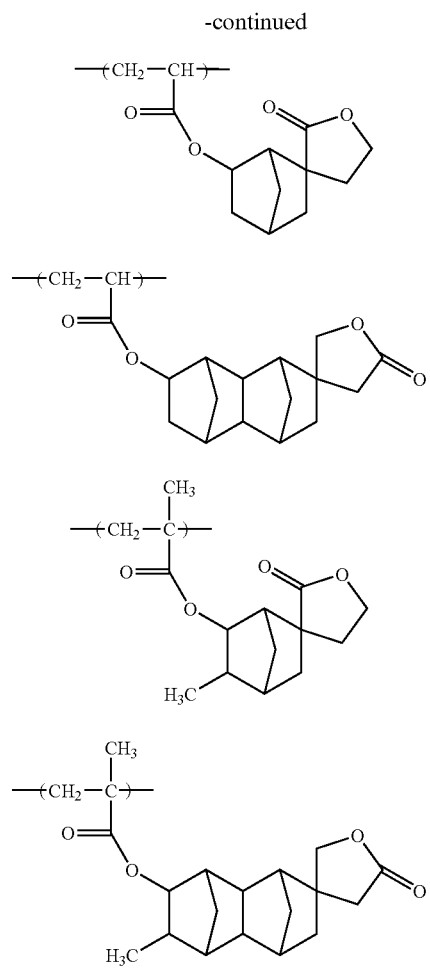

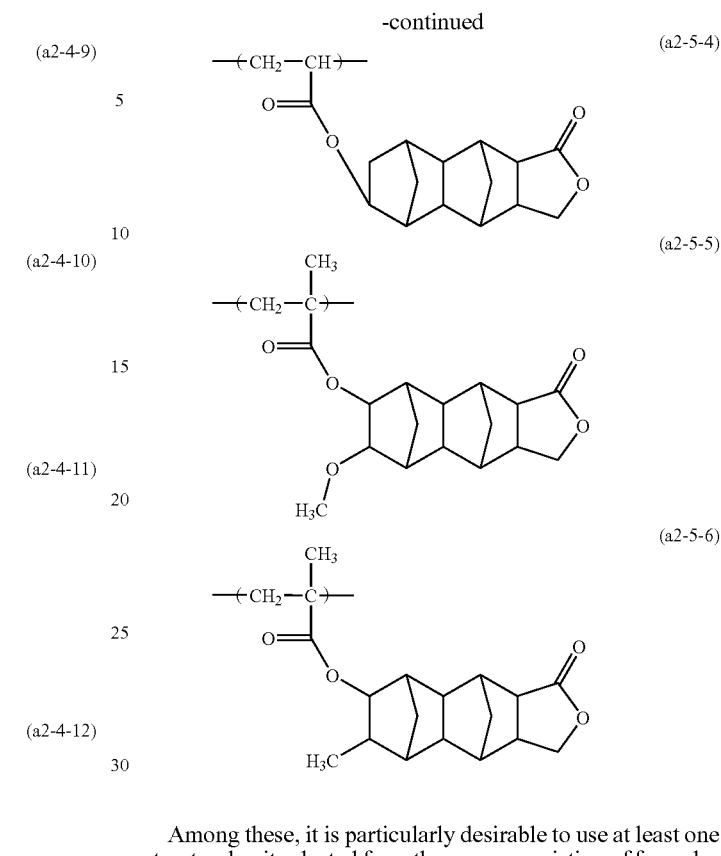

Among these, it is particularly desirable to use at least one structural unit selected from the group consisting of formulas (a2-1-1), (a2-1-2), (a2-2-1), (a2-2-2), (a2-3-1), (a2-3-2), (a2-3-9) and (a2-3-10), and the structural unit represented by (a2-1-2) is most preferable.

In the copolymer (A1), as the structural unit (a2), one type of structural unit may be used, or two or more types may be used in combination.

In the copolymer (A1), the amount of the structural unit (a2) based on the combined total of all structural units constituting the copolymer (A1) is preferably 5 to 60 mol %, more preferably 10 to 50 mol %, still more preferably 20 to 50 mol %, and most preferably 25 to 45 mol %. By making the amount of the structural unit (a2) at least as large as the lower limit of the above-mentioned range, the effect of using the structural unit (a2) can be satisfactorily achieved. On the other hand, by making the amount of the structural unit (a2) no more than the upper limit of the above-mentioned range, a good balance can be achieved with the other structural units.

Structural Unit (a3)

The copolymer (A1) has a structural unit (a3) derived from an acrylate ester having a hydroxyl group and/or cyano group-containing polycyclic group, as well as the structural unit (a1) and the structural unit (a2).

By including the structural unit (a3), the hydrophilicity of the component (A) is improved, and hence, the affinity of the component (A) to the developing solution is improved. As a result, the alkali solubility of the exposed portions improves, which contributes to favorable improvements in the resolution.

Among a hydroxyl group, cyano group and a hydroxyalkyl group in which some of the hydrogen atoms have been substituted with fluorine atoms, the polycyclic group contains at least a hydroxyl group and/or a cyano group as the polar group. The polycyclic group preferably contains a hydroxyl group.

As examples of the polycyclic group, polycyclic aliphatic hydrocarbon groups can be mentioned. The polycyclic group can be appropriately selected from the multitude of structural units proposed for chemically amplified resins.

Among these, structural units which contain aliphatic polycyclic group which have at least a hydroxyl group and/or a cyano group amongst a hydroxyl group, cyano group, carboxyl group and a hydroxyalkyl group in which some of the hydrogen atoms have been substituted with fluorine atoms are preferable. Examples of suitable polycyclic groups include groups in which one or more hydrogen atoms have been removed from a bicycloalkane, tricycloalkane or tetracycloalkane or the like. Specific examples include groups in which one or more hydrogen atoms have been removed from a polycycloalkane such as adamantane, norbornane, isobornane, tricyclodecane or tetracyclododecane. Of these polycyclic groups, groups in which two or more hydrogen atoms have been removed from an adamantyl group, norbornyl group, or tetracyclododecanyl group is preferred industrially.

Specifically, as the structural unit (a3), structural units represented by formulas (a3-1), (a3-2) and (a3-3) are preferable, and structural units represented by formulas (a3-1) and (a3-2) are particularly desirable.

[Chemical Formula 25]

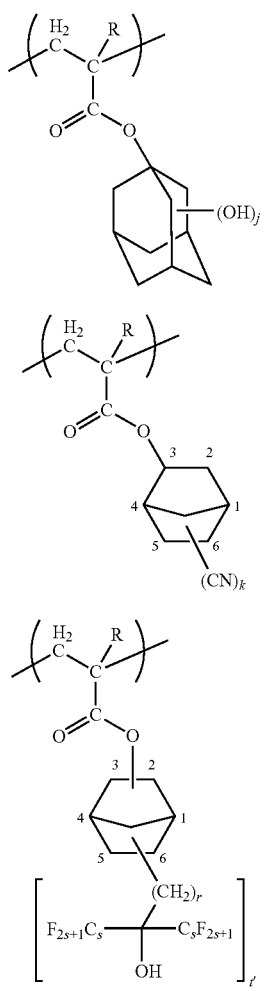

wherein R represents a hydrogen atom, a halogen atom, a lower alkyl group or a halogenated lower alkyl group; j represents an integer of 1 to 3; k represents an integer of 1 to 3; t' represents an integer of 1 to 3; r represents an integer of 1 to 5; and s represents an integer of 1 to 3.

In formula (a3-1), j is preferably 1 or 2, and more preferably 1. When j is 2, it is preferable that the hydroxyl groups be bonded to the 3rd and 5th position of the adamantyl group. When j is 1, it is particularly desirable that the hydroxyl group be bonded to the 3rd position of the adamantyl group.

j is preferably 1, and is particularly desirable that the hydroxyl group be bonded to the 3rd position of the adamantyl group.

In formula (a3-2), k is preferably 1. The cyano group is preferably bonded to the 5th or 6th position of the norbonyl group.

In formula (a3-3), t' is preferably 1, r is preferably 1 and s is preferably 1.

Further, in formula (a3-3), it is preferable that a 2-norbornyl group or 3-norbornyl group be bonded to the terminal of the carboxy group of the (α-lower alkyl) acrylic acid.

The fluorinated alkyl alcohol (hydroxyalkyl group in which some of the hydrogen atoms of the alkyl group are substituted with fluorine atoms) is preferably bonded to the 5th or 6th position of the norbonyl group.

Among these, the structural units represented by formula (a3-1) are particularly desirable.

As the structural unit (a3), one type of structural unit may be used, or two or more types may be used in combination.

In the copolymer (A1), the amount of structural unit (a3) based on the combined total of all structural units constituting the copolymer (A1) is preferably 5 to 50 mol %, more preferably 5 to 40 mol %, and most preferably 10 to 25 mol %.

Structural Unit (a4)

The copolymer (A1) has the structural unit represented by general formula (a4-1) shown above, as well as the aforementioned structural units (a1) to (a3).

By possessing the structural unit (a4), defects are further reduced. Especially, the wine stain-type defects (color fluctuation) are suppressed. It is presumed that the hydrophilicity of the component (A) is enhanced by the structural unit (a4), and the affinity of the component (A) to the developing solution is improved, and as a result, the effect of reducing defects is achieved.

Further, by possessing the structural unit (a4), various lithography properties such as depth of focus (DOF) and the shape of the resist pattern are improved.

In general formula (a4-1), R represents a hydrogen atom, a halogen atom, a lower alkyl group or a halogenated lower alkyl group. The halogen atom, lower alkyl group or halogenated lower alkyl group for R in general formula (a4-1) are the same as same as the halogen atom lower alkyl group or halogenated lower alkyl group which can be bonded to the α-position of the aforementioned acrylate ester.

In general formula (a4-1), R' represents a hydrogen atom, a lower alkyl group or an alkoxy group of 1 to 5 carbon atoms.

The lower alkyl group for R' are the same as the lower alkyl group for R in the structural unit (a1).

In terms of industrial availability, R' is preferably a hydrogen atom. When two R' are present, the two R' may be the same or different. f is 0 or 1, and preferably 1 as the lithography properties are improved.

As the structural unit (a4), one type of structural unit may be used, or two or more types may be used in combination.

In the copolymer (A1), the amount of structural unit (a4) based on the combined total of all structural units constituting the copolymer (A1) is preferably 1 to 15 mol %, more preferably 2 to 13 mol %, and most preferably 3 to 10 mol %. By making the amount of the structural unit (a4) at least as large as the lower limit of the above-mentioned range, defects can be satisfactorily reduced, and excellent lithography properties can be achieved. On the other hand, by making the amount of the structural unit (a4) no more than the upper limit of the above-mentioned range, a good balance can be achieved with the other structural units.

Other Structural Units

The copolymer (A1) may further contain a structural unit which is other than the above-mentioned structural units (a1) to (a4), as long as the effects of the present invention are not impaired. However, in the copolymer (A1), the total amount of the above-mentioned structural units (a1) to (a4) based on the combined total of all structural units constituting the copolymer (A1) is preferably 70 mol % or more, more preferably 80 mol % or more, and most preferably 100 mol %.

As the structural unit which is other than the above-mentioned structural units (a1) to (a4) hereafter referred to as "structural unit (a5)"), any other structural unit which cannot be classified as one of the above structural units (a1) to (a4) can be used without any particular restrictions, and any of the multitude of conventional structural units used within chemically amplified resist resins for ArF excimer lasers or KrF excimer lasers (and particularly for ArF excimer lasers) can be used.

As the structural unit (a5), a structural unit which contains a non-acid-dissociable aliphatic polycyclic group, and is also derived from an acrylate ester is preferable. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In terms of industrial availability and the like, at least one polycyclic group selected from amongst a tricyclodecanyl group, adamantyl group, tetracyclododecanyl group, isobornyl group, and norbornyl group is particularly desirable. These polycyclic groups may have the hydrogen atoms substituted with linear or branched alkyl groups of 1 to 5 carbon atoms.

Specific examples of the structural unit (a5) include units with structures represented by general formulas (a5-1) to (a5-5) shown below.

[Chemical Formula 26]

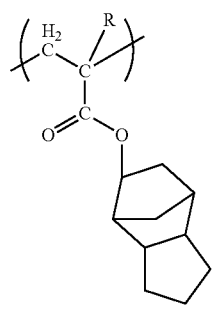
(a5-1)

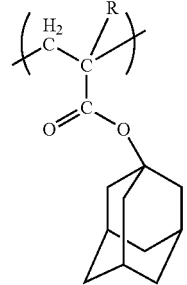
(a5-2)

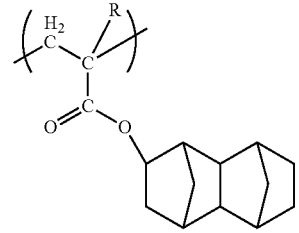
(a5-3)

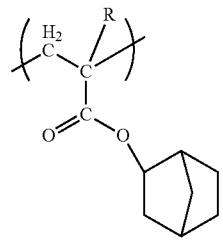
(a5-4)

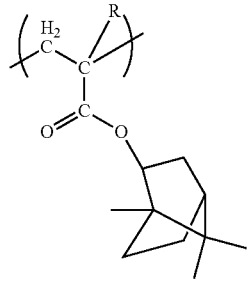
(a5-5)

wherein R represents a hydrogen atom, a halogen atom, a lower alkyl group or a halogenated lower alkyl group.

In formulas (a5-1) to (a5-5), the halogen atom, lower alkyl group and halogenated lower alkyl group for R are the same as the halogen atom lower alkyl group or halogenated lower alkyl group which can be bonded to the α-position of the aforementioned acrylate ester.

In the present invention, the copolymer (A1) includes at least the structural units (a1), (a2), (a3) and (a4).

Examples of the copolymer (A1) include a copolymer consisting of the structural units (a1), (a2), (a3) and (a4), and a copolymer consisting of the structural units (a1), (a2), (a3), (a4) and (a5). Of these, a copolymer consisting of the structural units (a1), (a2), (a3) and (a4), is preferable.

As the copolymer consisting of the structural units (a1), (a2), (a3) and (a4), for example, a copolymer represented by general formula (A1-1) shown below can be preferably used.

[Chemical Formula 27]

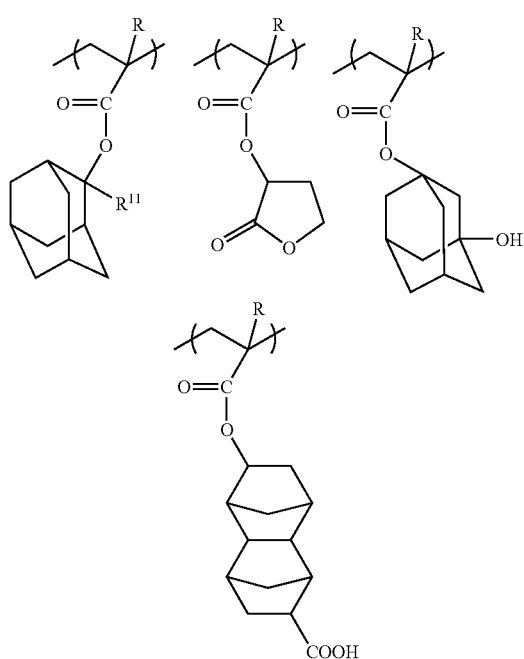

In formula (A1-1), R represents a hydrogen atom, a halogen atom, a lower alkyl group or a halogenated lower alkyl group, preferably a hydrogen atom or a lower alkyl group (preferably a methyl group).

In the formula (A1-1), the halogen atom, lower alkyl group and halogenated lower alkyl group for R are the same as the halogen atom lower alkyl group or halogenated lower alkyl group which can be bonded to the α-position of the aforementioned acrylate ester.

$R^{11}$ represents a lower alkyl group, and is same as the lower alkyl group for R, preferably a methyl group.

The copolymer (A1) can be obtained: for example, by a conventional radical polymerization or the like of the monomers corresponding with each of the structural units, using a radical polymerization initiator such as azobisisobutyronitrile (AIBN).

Furthermore, in the copolymer (A1), by using a chain transfer agent such as HS—$CH_2$—$CH_2$—$CH_2$—$C(CF_3)_2$—OH, a —$C(CF_3)_2$—OH group can be introduced at the terminals of the copolymer (A1).

Such a copolymer having introduced a hydroxyalkyl group in which some of the hydrogen atoms of the alkyl group are substituted with fluorine atoms is effective in decreasing developing defects and LER (line edge roughness: unevenness of the side walls of a line pattern).

The weight average molecular weight (Mw) (the polystyrene equivalent value determined by gel permeation chromatography (GPC)) of the copolymer (A1) is not particularly limited, but is preferably 2,000 to 50,000, more preferably 3,000 to 30,000, and most preferably 5,000 to 20,000. By making the weight average molecular weight no more than the upper limit of the above-mentioned range, the copolymer (A1) exhibits satisfactory solubility in a resist solvent. On the other hand, by making the weight average molecular weight at least as large as the lower limit of the above-mentioned range, dry etching resistance and cross-sectional shape of the resist pattern becomes satisfactory.

Further, the dispersity (Mw/Mn) is preferably 1.0 to 5.0, more preferably 1.0 to 3.0, and most preferably 1.2 to 2.5.

In the component (A), as the copolymer (A1), one type may be used alone, or two or more types may be used in combination.

In the positive resist composition of the present invention, the amount of the component (A) can be appropriately adjusted depending on the thickness of the resist film to be formed.

<Component (B)>

As the component (B), there is no particular limitation, and any of the known acid generators used in conventional chemically amplified resist compositions can be used.

Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

Examples of onium salt-based acid generators include compounds represented by general formula (b-1) or (b-2) shown below.

[Chemical Formula 28]

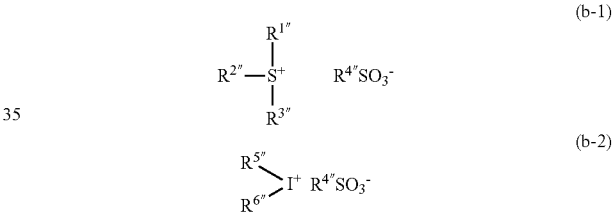

wherein $R^{1\prime\prime}$ to $R^{3\prime\prime}$, $R^{5\prime\prime}$ and $R^{6\prime\prime}$ each independently represents an aryl group or alkyl group; and $R^{4\prime\prime}$ represents a linear, branched or cyclic alkyl group or fluorinated alkyl group, with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. Among $R^{1\prime\prime}$ to $R^{3\prime\prime}$, at least one group represents an aryl group.

Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not specifically limited. For example, an aryl group having 6 to 20 carbon atoms may be used in which some or all of the hydrogen atoms of the aryl group may or may not be substituted with alkyl groups, alkoxy groups or halogen atoms.

The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group for $R^{1\prime\prime}$ to $R^{3\prime\prime}$ is not specifically limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that all of $R^{1\prime\prime}$ to $R^{3\prime\prime}$ are phenyl groups.

$R^{4\prime\prime}$ represents a linear, branched or cyclic alkyl or fluorinated alkyl group.

The linear alkyl group preferably has 1 to 10 carbon atoms, more preferably 1 to 8 carbon atoms, and most preferably 1 to 4 carbon atoms.

The cyclic alkyl group is preferably a cyclic group, as described for $R^{1\prime\prime}$, having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms.

Further, the fluorination ratio of the fluorinated alkyl group (ratio of fluorine atoms within the alkyl group) is preferably from 10 to 100%, more preferably from 50 to 100%, and it is particularly desirable that all hydrogen atoms are substituted with fluorine atoms because the acid strength increases.

$R^{4\prime\prime}$ is most preferably a linear or cyclic alkyl group or fluorinated alkyl group.

In formula (b-2), $R^{5\prime\prime}$ and $R^{6\prime\prime}$ each independently represents an aryl group or all group. At least one of $R^{5\prime\prime}$ and $R^{6\prime\prime}$ represents an aryl group. It is preferable that both of $R^{5\prime\prime}$ and $R^{6\prime\prime 7}$ represents an aryl group.

As the aryl group for $R^{5\prime\prime}$ and $R^{6\prime\prime}$, the same as the aryl groups for $R^{1\prime\prime}$ to $R^{3\prime\prime}$ can be exemplified.

As the alkyl group for $R^{5\prime\prime}$ and $R^{6\prime\prime}$, the same as the alkyl groups for $R^{1\prime\prime}$ to $R^{3\prime\prime}$ can be exemplified.

It is particularly desirable that both of $R^{5\prime\prime}$ and $R^{6\prime\prime}$ represents a phenyl group.

As $R^{4\prime\prime}$ in formula (b-2), the same as those mentioned above for $R^{4\prime\prime}$ in formula (b-1) can be exemplified.

Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl) diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, and diphenyl(1-(4-methoxy)naphthyl)sulfonium trifluoromethanesulfonate, heptafluoropropanesulfonate or nonafluorobutanesulfonate. It is also possible to use onium salts in which the anion moiety of these onium salts are replaced by methanesulfonate, n-propanesulfonate, n-butanesulfonate, or n-octanesulfonate.

Further, acid generators in which the anion moiety in general formula (b-1) or (b-2) is replaced with an anion moiety represented by general formula (b-3) or (b-4) shown below (the cation moiety is the same as (b-1) or (b-2)) may be used.

[Chemical Formula 29]

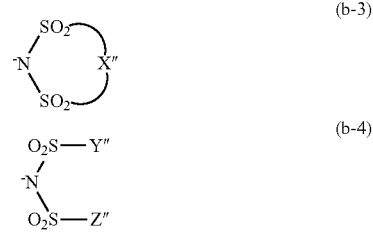

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group of X" or those of the alkyl group of Y" and Z" within the range of the number of carbon atoms, the more the solubility in a resist solvent becomes better.

Further, in the alkylene group of X" or the alkyl group of Y" and Z", it is preferable that the number of hydrogen atoms substituted with a fluorine atom is as large as possible, as the acid strength increases, and the transparency to high energy radiation of 200 nm or less or electron beam is improved. The fluorination ratio the alkylene group or alkyl group is preferably from 70 to 100%, more preferably from 90 to 100%, and it is particularly desirable that the alkylene group or alkyl group a perfluoroalkylene or perfluoroalkyl group in which all hydrogen atoms are substituted with fluorine atoms.

In the present invention, an oximesulfonate-based acid generator is a compound having at least one group represented by general formula (B-1) shown below, and has a feature of generating acid by irradiation. Such oxime sulfonate-based acid generators are widely used for a chemically amplified resist composition, and can be appropriately selected.

[Chemical Formula 30]

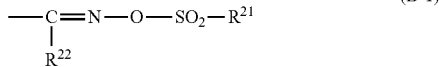

(B-1)

wherein $R^{21}$ and $R^{22}$ each independently represents an organic group.

In the invention, the 'organic group' refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{21}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are replaced with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, partially or completely halogenated alkyl group (hereinafter, sometimes referred to as a "halogenated alkyl group") is particularly desirable.

The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and the fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable.

The "partially halogenated aryl group" refers to an aryl group in which some of the hydrogen atoms are substituted with halogen atoms, and the "completely halogenated aryl group" refers to an aryl group in which all of hydrogen atoms are substituted by halogen atoms.

As $R^{21}$, an alkyl group of 1 to 4 carbon atoms which has no substituent or a fluorinated alkyl group of 1 to 4 carbon atoms is particularly desirable.

As the organic group for $R^{22}$, a linear, branched, or cyclic alkyl group, aryl group, or cyano group is preferable. Examples of the alkyl group and the aryl group for $R^{22}$ are the same as those of the alkyl group and the aryl group for $R^{21}$.

As $R^{22}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 31]

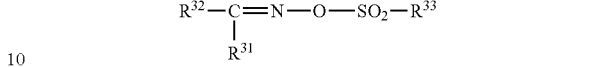

(B-2)

wherein $R^{31}$ represents a cyano group, an alkyl group having no substituent or a halogenated alkyl group; $R^{32}$ represents an aryl group; and $R^{33}$ represents an alkyl group having no substituent or a halogenated alkyl group.

[Chemical Formula 32]

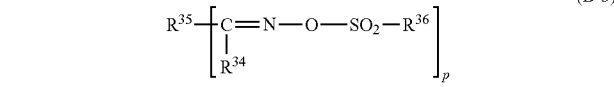

(B-3)

wherein $R^{34}$ represents a cyano group, an alkyl group having no substituent or a halogenated alkyl group; $R^{35}$ represents a divalent or trivalent aromatic hydrocarbon group; $R^{36}$ represents an alkyl group having no substituent or a halogenated alkyl group; and p represents 2 or 3.

In general formula (B-2), the alkyl group having no substituent or the halogenated alkyl group for $R^{31}$ preferably has 1 to 10 carbon atoms, more preferably 1 to 8 carbon atoms, and most preferably 1 to 6 carbon atoms.

As for the $R^{31}$, a halogenated alkyl group is preferable, and a fluorinated alkyl group is more preferable.

The fluorinated alkyl group for $R^{31}$ preferably has 50% or more of the hydrogen atoms thereof fluorinated, more preferably 70% or more, and still more preferably 90% or more.

Examples of the aryl group for $R^{32}$ include groups in which one hydrogen atom has been removed from an aromatic hydrocarbon ring, such as a phenyl group, a biphenyl group, a fluorenyl group, a naphthyl group, an anthracyl group, and a phenantryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{32}$ may have a substituent such as an alkyl group of 1 to 10 carbon atoms, a halogenated alkyl group, and alkoxy group. The alkyl group and the halogenated alkyl group serving as the substituent preferably has 1 to 8 carbon atoms, and more preferably 1 to 4 carbon atoms. The halogenated alkyl group thereof is preferably a fluorinated alkyl group.

The alkyl group having no substituent or the halogenated alkyl group for $R^{33}$ preferably has 1 to 10 carbon atoms, more preferably 1 to 8 carbon atoms, most preferably 1 to 6 carbon atoms.

As $R^{33}$, a halogenated alkyl group is preferable, and a partially or completely fluorinated alkyl group is more preferable.

In terms of enhancing the strength of the acid generated, the fluorinated alkyl group for $R^{33}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{34}$ are the same as the alkyl group having no substituent and the halogenated alkyl group for $R^{31}$.

Examples of the divalent or trivalent aromatic hydrocarbon group for $R^{35}$ include groups in which one or two hydrogen atoms have been removed from the aryl group for $R^{32}$.

As the alkyl group having no substituent or the halogenated alkyl group for $R^{36}$, the same one as the alkyl group having no substituent or the halogenated alkyl group for $R^{33}$ can be used.

p is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, compounds represented by chemical formulas shown below can be exemplified.

[Chemical Formula 33]

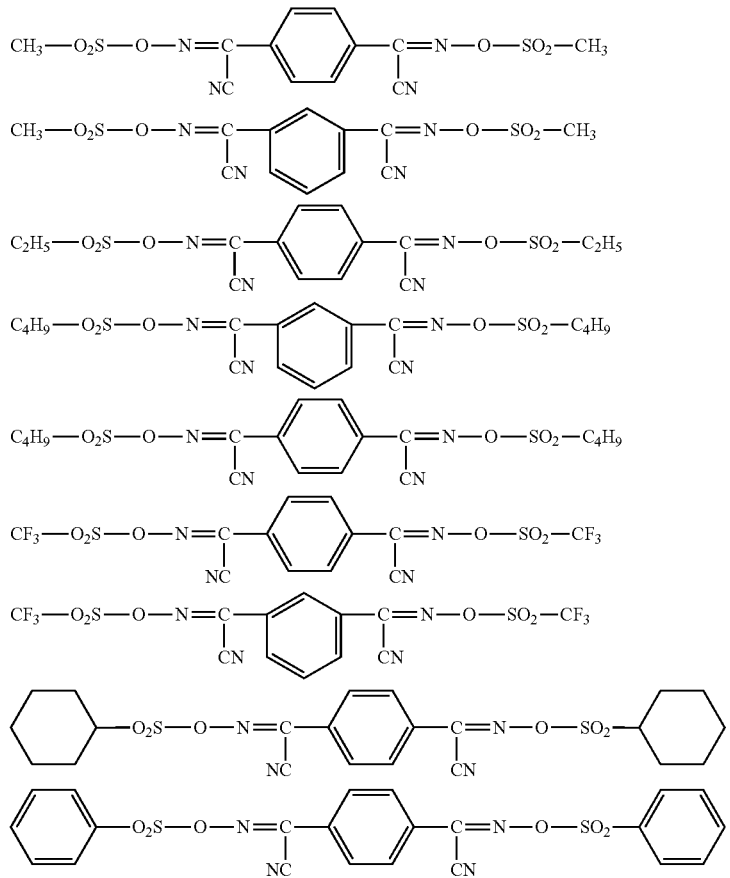

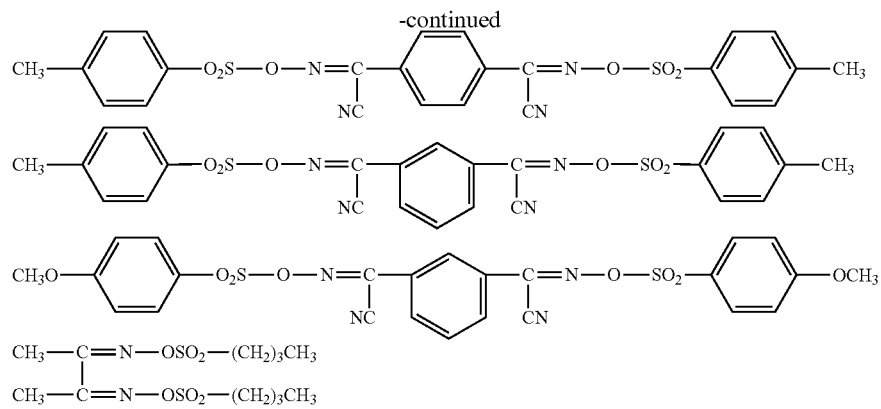
Furthermore, preferable compounds among the compounds represented by general formula (B-2) or (B-3) shown above are exemplified below.
[Chemical Formula 34]
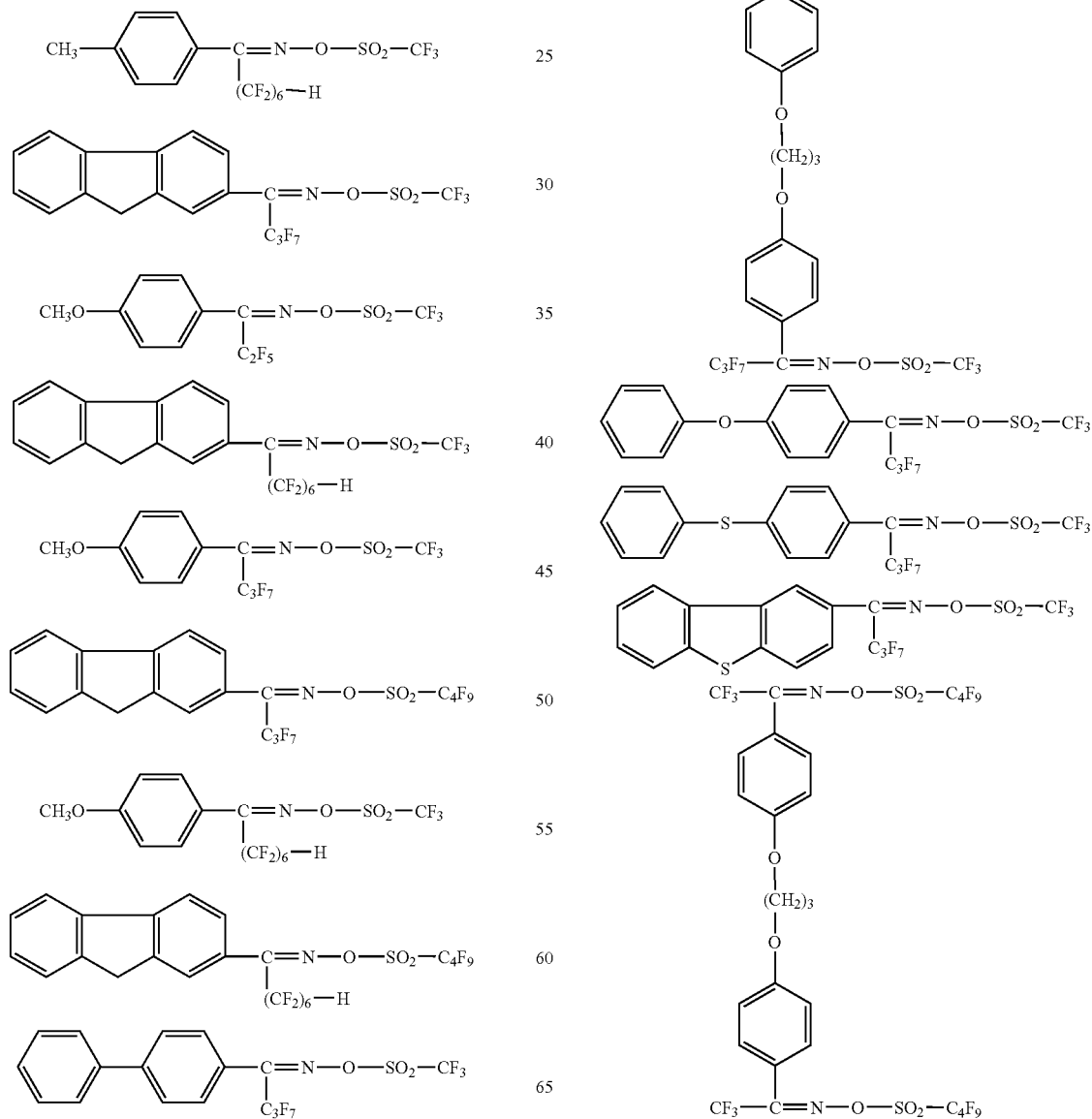

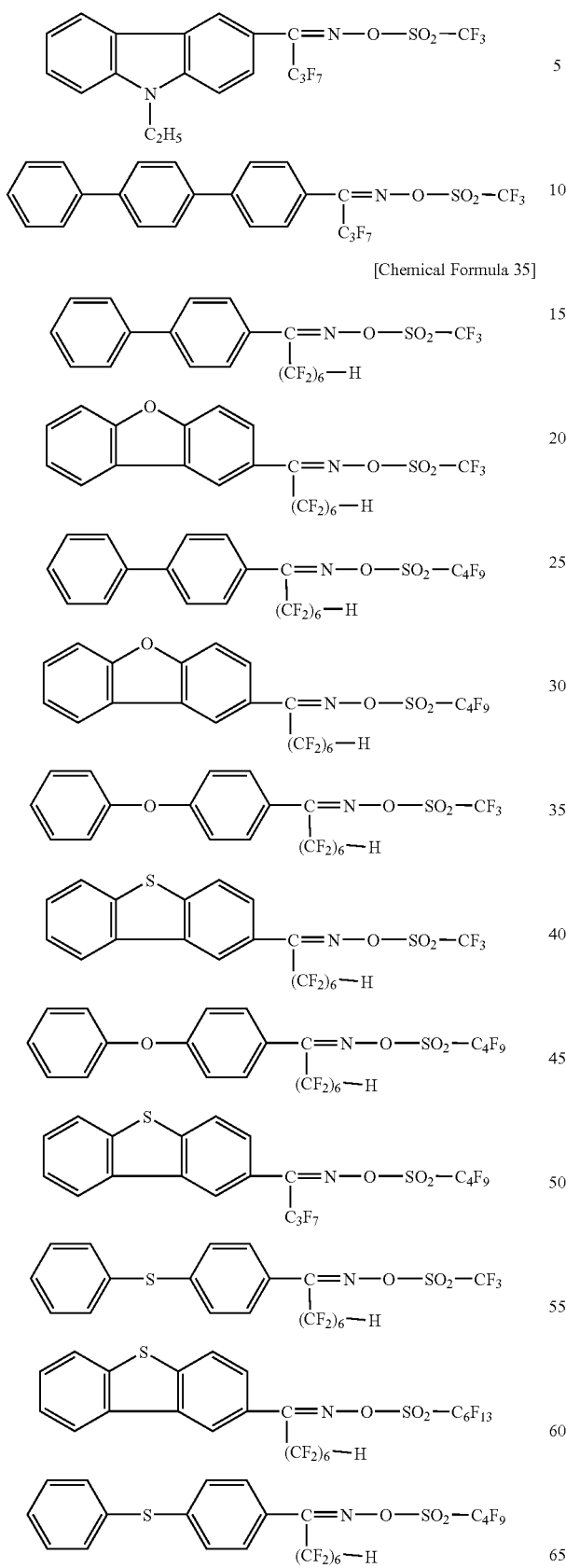

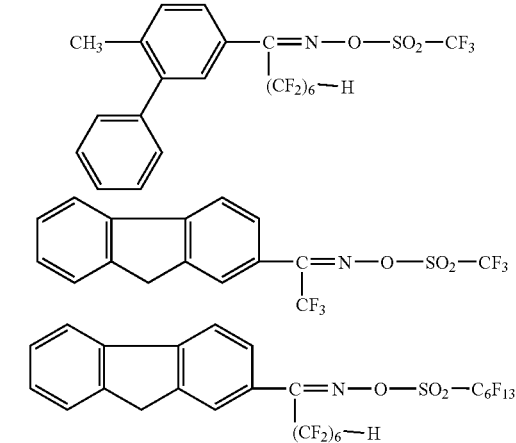

Among the above-exemplified compounds, the following 4 compounds are preferable.

[Chemical Formula 36]

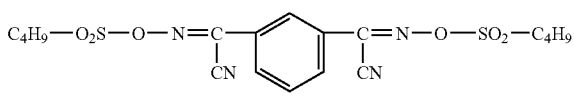

[Chemical Formula 37]

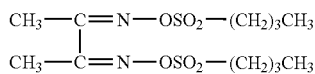

[Chemical Formula 38]

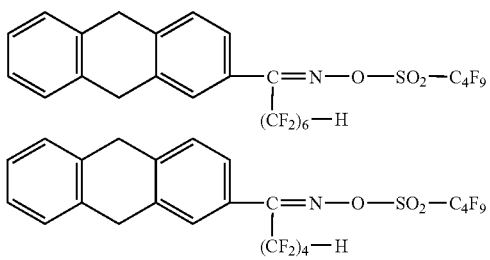

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethyl-sulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include those having the structures shown below, such as 1,3-bis(phenylsulfonyldiazomethylsulfonyl)propane (A=3),
1,4-bis(phenylsulfonyldiazomethylsulfonyl)butane (A=4),
1,6-bis(phenylsulfonyldiazomethylsulfonyl)hexane (A=6),
1,10-bis(phenylsulfonyldiazomethylsulfonyl)decane (A=10),
1,2-bis(cyclohexylsulfonyldiazomethylsulfonyl)ethane (B=2),
1,3-bis(cyclohexylsulfonyldiazomethylsulfonyl)propane (B=3),
1,6-bis(cyclohexylsulfonyldiazomethylsulfonyl)hexane (B=6), and 1,10-bis(cyclohexylsulfonyldiazomethylsulfonyl)decane (B=10).

[Chemical Formula 39]

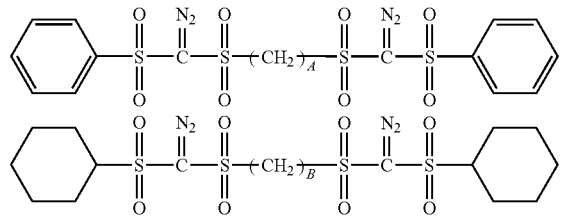

As the component (B), one type of compound may be used, or two or more types of compounds may be used in combination.

In the present invention, as the component (B), it is preferable to use an onium salt having a fluorinated alkylsulfonate ion or an alkylsulfonate ion as the anion moiety.

The amount of the component (B) is 0.5 to 30 parts by weight, and preferably 1 to 10 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Other Components>

In the positive resist composition of the present invention, for improving the resist pattern shape and the post exposure stability of the latent image formed by the pattern-wise exposure of the resist layer, it is preferable to add a nitrogen-containing organic compound (D) (hereafter referred to as the component (D)) as an optional component.

A multitude of these components (D) have already been proposed, and any of these known compounds may be used, although an aliphatic amine, and particularly a secondary aliphatic amine or tertiary aliphatic amine is preferable.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkyl alcohol amines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Among these, alkyl alcohol amines and trialkyl amines are preferable, and alkyl alcohol amines are particularly desirable. Among alkyl alcohol amines, triethanolamine and triisopropanolamine are preferable.

These compounds can be used either alone, or in combinations of two or more different compounds.

The component (D) is typically used in an amount within a range from 0.01 to 5.0 parts by weight, relative to 100 parts by weight of the component (A).

Furthermore, in the positive resist composition of the present invention, for preventing any deterioration in sensitivity caused by the addition of the above component (D), and improving the resist pattern shape and the post exposure stability of the latent image formed by the pattern-wise exposure of the resist layer, an organic carboxylic acid, or a phosphorus oxo acid or derivative thereof (E) (hereafter referred to as the component (E)) can also be added as another optional component. The component (D) and the component (E) can be used in combination, or either one can also be used alone.

Examples of suitable organic carboxylic acids include malonic acid, citric acid, malic acid, succinic acid, benzoic acid, and salicylic acid. Among these, salicylic acid is particularly desirable Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The positive resist composition of the present invention can be prepared by dissolving the materials for the resist composition (a component (A), a component (B) and optionally other components) in an organic solvent.

The organic solvent may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl isoamyl ketone, and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol, and monomethylether, monoethylether, monopropylether, monobutylether or monophenylether of any of these polyhydric alcohols; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These solvents can be used individually, or in combination as a mixed solvent.

Further, among the mixed solvents, a mixed solvent obtained by mixing propylene glycol monomethyl ether acetate (PGMEA) with a polar solvent is preferable. The mixing ratio (weight ratio) of the mixed solvent can be appropriately determined, taking into consideration the compatibility of the PGMEA with the polar solvent, but is preferably from 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2.

Further, a mixed solvent of at least one of PGMEA and EL with γ-butyrolactone is also preferable. The mixing ratio (former:latter) of such a mixed solvent is preferably from 70:30 to 95:5.

The amount of the organic solvent is not particularly limited, and is appropriately adjusted to a concentration which enables coating of a coating solution to a substrate, depending on the thickness of the coating film. In general, the organic solvent is used in an amount such that the solid content of the resist composition becomes within the range from 2 to 20% by weight, and preferably from 5 to 15% by weight.

<Method for Forming a Resist Pattern>

The method of forming a resist pattern according to the present invention includes: using a positive resist composition of the present invention to form a resist film on a substrate; conducting exposure of the resist film; and developing the resist film to form a resist pattern.

More specifically, the method for forming a resist pattern according to the present invention can be performed, for example, as follows.

Firstly, a positive resist composition according to the present invention is applied onto a substrate such as a silicon wafer using a spinner or the like, and a prebake is conducted under temperature conditions of 80 to 150° C. for 40 to 120 seconds, preferably 60 to 90 seconds to form a resist film.

Then, using an ArF exposure apparatus or the like, the resist film is selectively exposed to an ArF excimer laser beam (irradiated with radial ray) through a desired mask pattern followed by post exposure bake (PEB) under temperature conditions of 80 to 150° C. for 40 to 120 seconds, preferably 60 to 90 seconds.

Subsequently, developing is conducted using an alkali developing solution such as a 0.1 to 10% by weight aqueous solution of tetramethylammonium hydroxide. If desired, post bake can be conducted following the developing.

In this manner, a resist pattern that is faithful to the mask pattern can be obtained.

An organic or inorganic anti-reflective film may also be provided between the substrate and the applied layer of the resist composition.

The substrate is not specifically limited and conventionally known one can be used. For example, substrates for electronic components, and such substrates having wiring patterns formed thereon can be exemplified.

Examples of the material of the substrate include metals such as silicon wafer, copper, chromium, iron and aluminum; and glass.

Suitable materials for the wiring pattern include copper, solder, chrome, aluminum, nickel, and gold.

The wavelength to be used for exposure (irradiation with radial ray) is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays.

The positive resist composition of the present invention is particularly effective to ArF excimer laser.

EXAMPLES

As follows is a description of examples of the present invention, although the scope of the present invention is by no way limited by these examples.

Synthesis Examples

Synthesis of Resin (A)-1

Into a four-necked flask equipped with a nitrogen feeding pipe, a reflux condenser, a dropping funnel and a thermometer, 370 g of tetrahydrofuran, 44.6 g of 2-methyl-2-adamantyl methacrylate, 29.7 g of γ-butyrolactone acrylate, 22.4 g of 3-hydroxy-1-adamantyl methacrylate and 6.9 g of 5-methacryloyloxytetracyclododecane-10-carboxylic acid were charged, and the four-necked flask was purged with nitrogen, followed by elevating the temperature to 70° C. while stirring.

Then, while maintaining the temperature at 70° C., a polymerization initiator solution obtained by dissolving 11.5 g of a polymerization initiator V-601 (manufactured by Wako Pure Chemical Industries, Ltd.) in 17 g of tetrahydrofuran was dropwise added over 15 minutes.

Following the dropwise addition of the polymerization initiator solution, the resultant was stirred for 5 hours while maintaining the temperature at 70° C., and then cooled to 25° C. to complete the polymerization to obtain a polymer solution.

Subsequently, the obtained polymer solution was dropwise added to an excess amount of methanol/water mixed solvent to obtain a deposit. The deposit was filtered, washed and dried, thereby obtaining a resin (A)-1 (the formula (A)-1 shown below).

The results of the weight average molecular (Mw) in terms of the polystyrene equivalent value determined by gel permeation chromatography (GPC), the dispersity and the isotopic carbon nuclear magnetic resonance ($^{13}$C-NMR) were as follows. Ratio of structural units l:m:n:o=38.1:38.1:19:4.8 (molar ratio) Mw=10,000, Mw/Mn=2.0

[Chemical Formula 40]

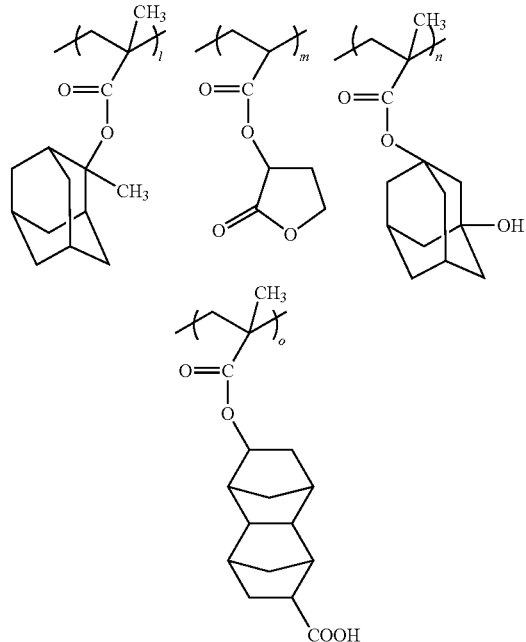

(A-1)

Synthesis of Resin (A)-2

Into a four-necked flask equipped with a nitrogen feeding pipe, a reflux condenser, a dropping funnel and a thermometer, 370 g of tetrahydrofuran, 42.6 g of 2-methyl-2-adamantyl methacrylate, 28.4 g of γ-butyrolactone acrylate, 21.5 g of 3-hydroxy-1-adamantyl methacrylate and 13.1 g of 5-methacryloyloxytetracyclododecane-10-carboxylic acid were charged, and the four-necked flask was purged with nitrogen, followed by elevating the temperature to 70° C. while stirring.

Then, while maintaining the temperature at 70° C., a polymerization initiator solution obtained by dissolving 11.5 g of a polymerization initiator V-601 (manufactured by Wako Pure Chemical Industries, Ltd.) in 17 g of tetrahydrofuran was dropwise added over 15 minutes.

Following the dropwise addition of the polymerization initiator solution, the resultant was stirred for 5 hours while maintaining the temperature at 70° C., and then cooled to 25° C. to complete the polymerization to obtain a polymer solution.

Subsequently, the obtained polymer solution was dropwise added to an excess amount of methanol/water mixed solvent to obtain a deposit. The deposit was filtered, washed and dried, thereby obtaining a resin (A)-2 (the formula (A)-2 shown below).

The results of the weight average molecular (Mw) in terms of the polystyrene equivalent value determined by gel permeation chromatography (GPC), the dispersity and the isotopic carbon nuclear magnetic resonance ($^{13}$C-NMR) were as follows. Ratio of structural units l:m:n:o=36.4:36.4:18.2:9 (molar ratio) Mw=10,000, Mw/Mn=2.0

[Chemical Formula 41]

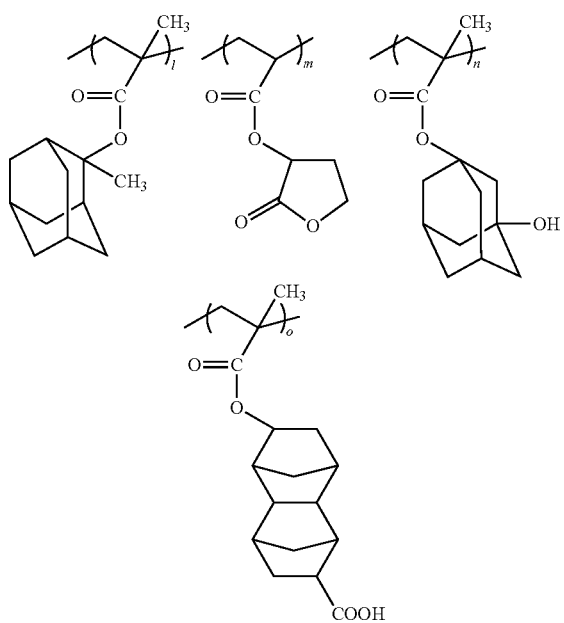

(A-2)

Synthesis of Resin (A)-3

Into a four-necked flask equipped with a nitrogen feeding pipe, a reflux condenser, a dropping funnel and a thermometer, 350 g of tetrahydrofuran, 46.8 g of 2-methyl-2-adamantyl methacrylate, 31.2 g of γ-butyrolactone acrylate and 23.6 g of 3-hydroxy-1-adamantyl methacrylate were charged, and the four-necked flask was purged with nitrogen, followed by elevating the temperature to 70° C. while stirring.

Then, while maintaining the temperature at 70° C., a polymerization initiator solution obtained by dissolving 11.5 g of a polymerization initiator V-601 (manufactured by Wako Pure Chemical Industries, Ltd.) in 17 g of tetrahydrofuran an was dropwise added over 15 minutes.

Following the dropwise addition of the polymerization initiator solution, the resultant was stirred for 5 hours while maintaining the temperature at 70° C., and then cooled to 25° C. to complete the polymerization to obtain a polymer solution.

Subsequently, the obtained polymer solution was dropwise added to an excess amount of methanol/water mixed solvent to obtain a deposit. The deposit was filtered, washed and dried, thereby obtaining a resin (A)-3 (the formula (A)-3 shown below).

The results of the weight average molecular (Mw) in terms of the polystyrene equivalent value determined by gel permeation chromatography (GPC), the dispersity and the isotopic carbon nuclear magnetic resonance ($^{13}$C-NMR) were as follows. Ratio of structural units l:m:n=40:40:20 (molar ratio) Mw=10,000, Mw/Mn=2.0

[Chemical Formula 42]

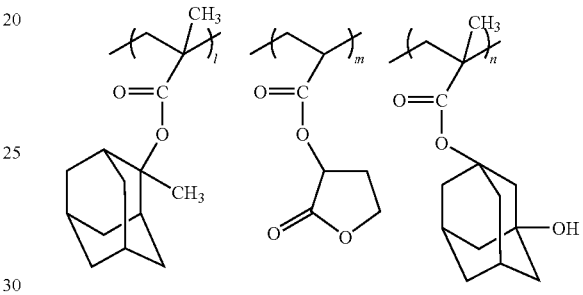

(A-3)

Examples 1 and 2 and Comparative Example 1

The components shown in Table 1 were mixed together and dissolved to obtain a positive resist composition solution.

TABLE 1

|  | (A) | (B) | (D) | (E) | (S) |
|---|---|---|---|---|---|
| Example 1 | (A)-1 | (B)-1 | (D)-1 | (E)-1 | (S)-1 |
|  | [100] | [3.5] | [0.1] | [0.1] | [750] |
| Example 2 | (A)-2 | (B)-1 | (D)-1 | (E)-1 | (S)-1 |
|  | [100] | [2.5] | [0.1] | [0.1] | [750] |
| Comparative Example 1 | (A)-3 | (B)-1 | (D)-1 | (E)-1 | (S)-1 |
|  | [100] | [2.5] | [0.1] | [0.1] | [750] |

In Table 1, the values in brackets [ ] indicate the amount (in terms of parts by weight) of the component added.

(B)-1: (4-methylphenyl)diphenylsulfonium nonafluorobutanesulfonate (D)-1: triethanolamine (E)-1: salicylic acid (S)-1: a mixed solvent of PGMEA/EL 8/2 (weight ratio)

(Evaluation)

Using the obtained positive resist composition solution, evaluations were performed as follows with respect to depth of focus (DOF, μm) and resist pattern shape for the lithography properties, and defects.

Evaluation of Depth of Focus (DOF)

An organic antireflection film composition "ARC-29A" (trade name; manufactured by Brewer Science Ltd.) was applied onto an 8 inch silicon wafer using a spinner. Then, the silicon wafer was sintered and dried on a hot plate at 205° C. for 60 seconds, thereby forming an organic antireflection film having a thickness of 77 nm.

The positive resist composition solution was applied onto the antireflection film using a spinner. Then, post applied bake (PAB) was conducted on a hot plate at a PAB temperature indicated in Table 2 for 90 seconds to dry the positive resist composition, thereby forming a resist film having a thickness of 220 nm.

Subsequently, using an ArF exposure apparatus NSR-S306 (manufactured by Nikon; numerical aperture (NA)=0.78, σ=0.9), an ArF excimer laser (193 nm) was selectively irradiated through a mask pattern (6% half tone).

Thereafter, the irradiated resist film was subjected to post exposure bake (PEB) at a PEB temperature indicated in Table 2 for 90 seconds, followed by paddle development for 60 seconds at 23° C. in a 2.38% by weight aqueous solution of tetramethylammonium hydroxide (TMAH), washing with water for 20 seconds and drying, thereby forming a hole pattern having a diameter of 100 mm (print/mask/pitch 100 nm/160 nm/1,000 nm).

In the optimum exposure dose (mJ/cm$^2$) at which a hole pattern having a diameter of 100 nm is formed, the focus was appropriately shifted up and down, and the depth of focus (DOF) (μm) was determined within the range where the size change of the diameter of an isolated hole pattern was 100 nm±10%.

As a result, it was found that the hole patterns of Examples 1 and 2 exhibited a satisfactory DOF value (0.2 μn) which was approximately the same as the hole pattern of Comparative Example 1.

Evaluation of Resist Pattern

The resist pattern formed in the DOF evaluation was observed using a scanning electron microscope (SEM), and the shape of the resist pattern was evaluated.

As a result, it was found that the resist patterns of Examples 1 and 2 had a satisfactory shape which was similar to the shape of the resist pattern of Comparative Example 1.

Evaluation of Defects

Using a spinner, the positive resist composition solution was directly applied onto an 8 inch silicon wafer which had been treated with hexamethyldisilazane (HMDS), and post applied bake (PAB) was conducted on a hot plate at a PAB temperature indicated in Table 2 for 90 seconds to dry the positive resist composition, thereby forming a resist film having a thickness of 220 nm.

Subsequently, using an ArF exposure apparatus NSR-S306 (manufactured by Nikon; numerical aperture (NA)=0.78, σ=0.30), an ArF excimer laser (193 nm) was selectively irradiated through a mask pattern (binary).

Thereafter, the irradiated resist film was subjected to post exposure bake (PEB) at a PEB temperature indicated in Table 2 for 90 seconds, followed by paddle development for 60 seconds at 23° C. in a 2.38% by weight aqueous solution of tetramethylammonium hydroxide (TMAH). Then, a rinse solution was dropwise added under conditions of 1,000 revolutions for 1 second, followed by 500 revolutions for 15 seconds (forced condition under which defects are easily generated), followed by drying, thereby forming a resist pattern.

The pattern was a dense hole pattern having a hole diameter of 300 nm (a pattern in which hole patterns having a diameter of 300 nm were arranged at intervals of 300 nm).

Subsequently, the number of defects within the wafer was evaluated using a surface defect inspection device KLA2351 (a product name) manufactured by KLA Tencor Corporation. The results are shown in Table 2.

TABLE 2

| | PAB temperature (° C.) | PEB temperature (° C.) | Defects |
|---|---|---|---|
| Example 1 | 105 | 100 | 10,435 |
| Example 2 | 105 | 100 | 1,052 |
| Comparative Example 1 | 105 | 100 | 30,296 |

As shown in Table 2, it was confirmed that the resist patterns of Examples 1 and 2 exhibited a relatively high defect reducing effect as compared to the resist pattern of Comparative Example 1.

Further, the depth of focus (DOF) and the shape of the resist pattern of Examples 1 and 2 were as good as those of Comparative Example 1, and hence, it was confirmed that the resist patterns of Examples 1 and 2 had the essential lithography properties.

INDUSTRIAL APPLICABILITY

According to the present invention, there is provided a positive resist composition which not only has essential lithography properties, but also is capable of reducing defects in a resist pattern, and a method of forming a resist pattern.

The invention claimed is:

1. A positive resist composition comprising a resin component (A) which exhibits increased alkali solubility under action of acid and an acid generator component (B) which generates acid upon exposure,
said resin component (A) comprising a copolymer (A1) having a structural unit (a1) derived from an acrylate ester having a monocyclic or polycyclic group-containing acid dissociable, dissolution inhibiting group, a structural unit (a2) derived from an acrylate ester having a lactone-containing cyclic group, a structural unit (a3) derived from an acrylate ester having a hydroxyl group and/or cyano group-containing polycyclic group, and a structural unit (a4) represented by general formula (a4-1) shown below:

[Chemical Formula 1]

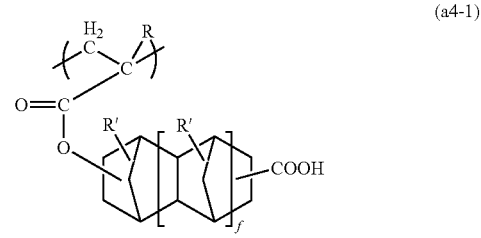

wherein R represents a hydrogen atom, a halogen atom, a lower alkyl group or a halogenated lower alkyl group; R' represents a hydrogen atom, a lower alkyl group or an alkoxy group of 1 to 5 carbon atoms, wherein when two R' are present, the two R' may be the same or different; and f represents 0 or 1,
wherein the amounts of the structural units based on the combined total of all structural units constituting the copolymer (A1) are 30 to 50 mol % for the structural unit (a1), 25 to 45 mol % for the structural unit (a2), 10 to 25 mol % for the structural unit (a3), and 3 to 10 mol % for the structural unit (a4).

2. The positive resist composition according to claim 1, further comprising a nitrogen-containing organic compound (D).

3. A method of forming a resist pattern, comprising: using a positive resist composition of claim 1 to form a resist film on a substrate; conducting exposure of said resist film; and developing said resist film to form a resist pattern.

* * * * *

UNITED STATES PATENT AND TRADEMARK OFFICE
CERTIFICATE OF CORRECTION

PATENT NO. : 7,855,044 B2
APPLICATION NO. : 11/993005
DATED : December 21, 2010
INVENTOR(S) : Takeshita et al.

It is certified that error appears in the above-identified patent and that said Letters Patent is hereby corrected as shown below:

Column 1, Line 61, change "μnm." to --nm.--.

Column 4, Lines 52–53, change "chemical" to --chemically--.

Column 6, Line 10, after "substituent" insert --.--.

Column 36, Line 56, change "(a1-0-1)" to --(a1-1-1)--.

Column 36, Line 66, change "(a1-0-36)," to --(a1-1-36),--.

Column 38, Line 12, after "group"" delete ",".

Column 49, Line 21, change "hereafter" to --(hereafter--.

Column 50, Line 64, change "(a4)," to --(a4)--.

Column 51, Line 43, change "obtained:" to --obtained,--.

Column 53, Line 40, change "all" to --alkyl--.

Column 53, Line 42, change "$R^{6''7''}$" to --$R^{6''}$--.

Column 62, Lines 35–42, change " 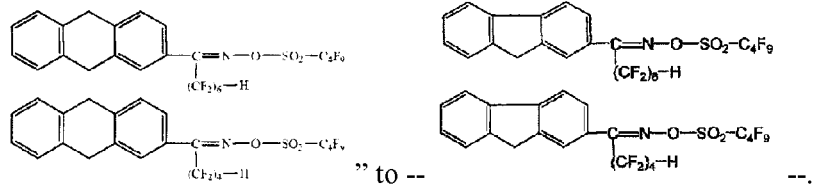 ".

Column 64, Line 10, after "desirable" insert --.--.

Column 65, Line 22, after "pattern" insert --,--.

Column 67, Line 64, after "tetrahydrofuran" delete "an".

Column 68, Line 55, after "PGMEA/EL" insert --=--.

Column 69, Line 2, change "fihn" to --film--.

Column 69, Line 18, change "100 mm" to --100 nm--.

Column 69, Line 18, after "pitch" insert --=--.

Signed and Sealed this
Twenty-seventh Day of March, 2012

David J. Kappos
*Director of the United States Patent and Trademark Office*

CERTIFICATE OF CORRECTION (continued)
U.S. Pat. No. 7,855,044 B2

Column 69, Line 27, change "(0.2 μn)" to --(0.2 μm)--.